(12) United States Patent
Sasaki

(10) Patent No.: US 7,224,441 B2
(45) Date of Patent: May 29, 2007

(54) PROJECTION OPTICAL SYSTEM, EXPOSURE APPARATUS, AND DEVICE MANUFACTURING METHOD

(75) Inventor: Takahiro Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/365,046

(22) Filed: Feb. 28, 2006

(65) Prior Publication Data

US 2006/0209302 A1  Sep. 21, 2006

(30) Foreign Application Priority Data

Mar. 1, 2005   (JP) .............................. 2005-056701

(51) Int. Cl.
  *G03B 27/54* (2006.01)
  *G03B 27/42* (2006.01)
(52) U.S. Cl. .......................................... 355/67; 355/53
(58) Field of Classification Search .................. 355/52, 355/53, 55, 67–71; 359/365, 631, 859; 356/369
See application file for complete search history.

(56) References Cited

U.S. PATENT DOCUMENTS

| | | | |
|---|---|---|---|
| 6,033,079 A | 3/2000 | Hudyma | |
| 6,199,991 B1 | 3/2001 | Braat | |
| 6,255,661 B1 | 7/2001 | Braat | |
| 6,353,470 B1 | 3/2002 | Dinger | |
| 6,600,552 B2 | 7/2003 | Dinger | |
| 6,902,283 B2 * | 6/2005 | Dinger | ........................ 359/859 |
| 7,151,592 B2 * | 12/2006 | Hudyma et al. | .............. 355/67 |
| 2002/0176063 A1 | 11/2002 | Omura | |

FOREIGN PATENT DOCUMENTS

| | | |
|---|---|---|
| JP | 2000-235144 | 8/2000 |
| JP | 2001-185480 | 7/2001 |
| JP | 2003-15040 | 1/2003 |
| JP | 2004-22722 | 1/2004 |
| JP | 2004-31808 | 1/2004 |
| JP | 2004-138926 | 5/2004 |
| JP | 2004-170869 | 6/2004 |
| JP | 2004-258178 | 9/2004 |
| WO | 03/005097 | 1/2003 |

* cited by examiner

*Primary Examiner*—Henry Hung Nguyen
(74) *Attorney, Agent, or Firm*—Morgan & Finnegan LLP

(57) ABSTRACT

A projection optical system for projecting a pattern on an object plane onto an image plane includes first to sixth reflective surfaces in order to reflect light from the object plane, wherein A1=θ21/θ11, B1=θ31/θ11, 1.5<A1<1.65, and 2.3<B1<2.5 are met. θ11 is an angle on a predetermined plane between a principal ray and a plane normal to the first reflective surface at an incident position of the principal ray. θ21 is an angle on the predetermined plane between the principal ray and a plane normal to the second reflective surface at an incident position of the principal ray. θ31 is an angle on the predetermined plane between the principal ray and a plane normal to the third reflective surface at an incident position of the principal ray.

10 Claims, 14 Drawing Sheets

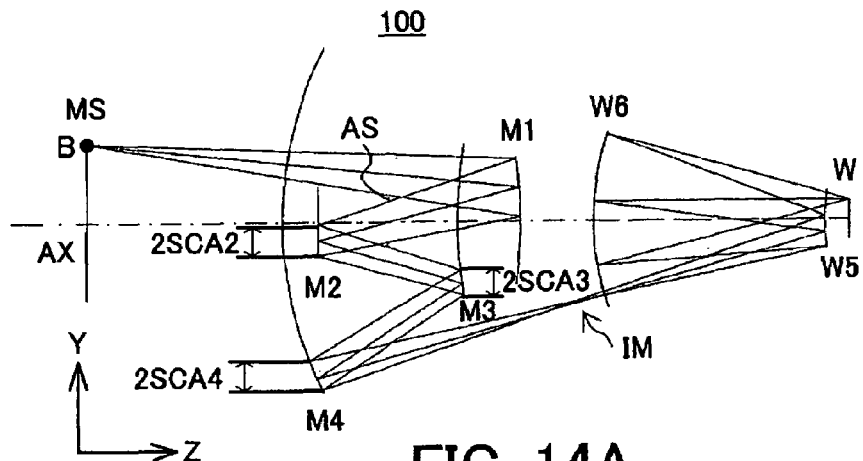
FIG. 14A
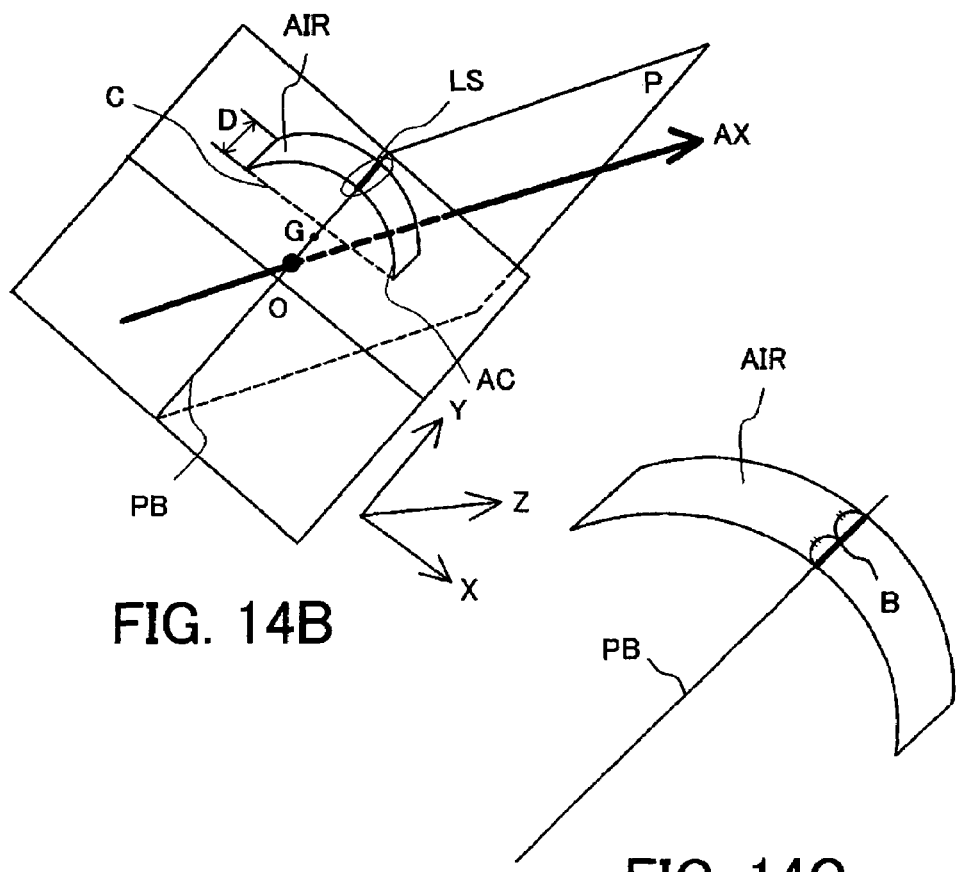
FIG. 14B
FIG. 14C

PROJECTION OPTICAL SYSTEM, EXPOSURE APPARATUS, AND DEVICE MANUFACTURING METHOD

BACKGROUND OF THE INVENTION

The present invention relates generally to a projection optical system and an exposure apparatus having the same, and more particularly to a catoptric projection optical system, an exposure apparatus, and a device manufacturing method, which utilizes the extreme ultraviolet ("EUV") as a light source to expose a plate, such as a single crystal substrate for a semiconductor wafer, and a glass plate for a liquid crystal display ("LCD").

Along with recent demands for smaller and lower profile electronic devices, the fine processing to semiconductor devices to be mounted onto these electronic devices has been increasingly demanded. For the demand of the fine processing to the semiconductor device, a reduction to practice of a reduction projection exposure apparatus using EUV light with a wavelength less than 20 nm (such as about 13.5 nm) shorter than that of the UV light (referred to as an "EUV exposure apparatus" hereinafter) has been studied. Since there is no usable glass material for the EUV light as the exposure light, and a catoptric projection optical system is proposed which includes only mirrors (e.g., multilayer mirrors).

The smaller number of mirrors is preferable for the catoptric projection optical system to enhance the reflectance of the entire optical system. In addition, the even number of mirrors is preferable so that the mask and the wafer oppose to each other with respect to the pupil to prevent mechanical interference between the mask and wafer. In addition, as the critical dimension ("CD") or resolution required for the EUV exposure apparatus has been smaller than the conventional value (for example, currently 32 nm node is required), a numerical aperture ("NA") at the image side should be increased, but it is difficult four three or four mirrors to reduce the wavefront aberration. Accordingly, it is preferable that the number of mirrors is made six so as to increase the degree of freedom to correct the wavefront aberration. See, for example, U.S. Pat. No. 6,033,079 and Japanese Patent Application, Publication No. 2003-15040.

U.S. Pat. No. 6,033,079 discloses a typical projection optical system that includes six mirrors for two EUV lights. The projection optical system receives the incident light form the object plane, and forms an intermediate image via a first concave reflective surface, a second concave or convex reflective surface, or a third convex reflective surface. The projection optical system re-images the intermediate image on the image plane via a fifth convex reflective surface, and a sixth concave reflective surface. The projection optical system provides an aperture stop on the second reflective surface.

Japanese Patent Application, Publication No. 2003-15040 discloses a typical projection optical system that includes six mirrors for two EUV lights. The projection optical system receives the incident light form the object plane, and forms an intermediate image via a first concave reflective surface, a second convex reflective surface, a third convex reflective surface, and a fourth concave reflective surface. The projection optical system re-images the intermediate image on the image plane via a fifth convex reflective surface, and a sixth concave reflective surface. The projection optical system provides an aperture stop between the second and third reflective surfaces.

Other prior art that disclose similar optical systems are Japanese Patent Applications, Publication Nos. 2004-22722, 2004-170869, 2004-138926, 2000-235144, 2001-185480, 2004-31808, 2004-138926, and 2004-258178, and U.S. Pat. Nos. 6,199,991 and 6,255,661.

However, the first embodiment described in U.S. Pat. No. 6,033,079 has a problem of a plane interval or separation. Le1/TT=0.4201, Le2/TT=0.4202, and Le3/TT=0.4686 are met. Since these values are approximately the same, there occur problems in that the front focus is short and the arrangement of components is difficult. Here, TT is an absolute value between the object and image. Le1 is an absolute value of the interval between the plane apexes of the first and second reflective surfaces on the optical axis. Le2 is an absolute value of the interval between the plane apexes of the second and third reflective surfaces on the optical axis. Le3 is an absolute value of the interval between the plane apexes of the third and fourth reflective surfaces on the optical axis.

The first embodiment in Japanese Patent Application, Publication No. 2003-15040 has a problem of a light incident angle upon the surface. On the predetermined plane, angle $\theta 11$ is 25.83° between the first reflective surface and the principal ray that is existed from the object point at the center of an arc-shaped illuminated area on the object plane. Angle $\theta 21$ is 39.35° between the principal ray and the second reflective surface. Angle $\theta 31$ is 35.44° between the principal ray and the third reflective surface. Thus, values of $\theta 21$ and $\theta 31$ are large. The sixth mirror M6 has a large effective diameter for a high NA, and the fourth mirror M4 is located apart from the optical axis to introduce the light to the fifth mirror M5 to avoid the sixth mirror M6. In order to introduce the light from the object to M4, the incident angles at the second and third mirrors become very large and unnaturally deflect the light, thereby posing problems of a generation of an aberration and a lowered reflectance due to the influence of the multilayer coating. As a result, this configuration cannot provide highly precise exposure or lowers the throughput due to the decreased light intensity.

BRIEF SUMMARY OF THE INVENTION

The present invention is directed to a projection optical system, an exposure apparatus and a device manufacturing method, which can achieve both resolution and arrangement convenience.

A projection optical system according to one aspect of the present invention for projecting a pattern on an object plane onto an image plane includes first to sixth reflective surfaces in order to reflect light from the object plane, the light from the object plane being reflected in order of the first reflective surface, the second reflective surface, third reflective surface, the fourth reflective surface, the fifth reflective surface, and the sixth reflective surface, wherein $A1=\theta 21/\theta 11$, $B1=\theta 31/\theta 11$, $1.5<A1<1.65$, and $2.3<B1<2.5$ are met, where $\theta 11$ is an angle between a first principal ray and a first plane normal on a predetermined plane, $\theta 21$ is an angle between a second principal ray and a second plane normal on the predetermined plane, and $\theta 31$ is an angle between a third principal ray and a third plane normal on the predetermined plane, wherein the first principal ray is a principal ray that is exited from a center of an arc-shaped illuminated area on the object plane and incident upon the first reflective surface, and the first plane normal is a plane normal to the first reflective surface at an incident position of the first principal ray that is exited from the center of the illumination area and incident upon the first reflective surface, wherein the second principal ray is a principal ray that is exited from the center of the illumination area, reflected on the first reflective surface, and incident upon the second reflective surface, and the second plane normal is a plane normal to the second reflective surface at an incident position of the second principal ray that is exited from the center of the illumination area, reflected on the first reflective surface, and incident upon the second reflective surface, and wherein the third principal ray is a principal ray that is exited from the center of the illumination area, reflected on the second reflective surface, and incident upon the third reflective surface, and the third plane normal is a plane normal to the third reflective surface at an incident position of the third principal ray that is exited from the center of the illumination area, reflected on the second reflective surface, and incident upon the third reflective surface.

A projection optical system according to another aspect of the present invention for projecting a pattern on an object plane onto an image plane includes six reflective surfaces that includes first to sixth reflective surfaces in order to reflect light from the object plane, the six reflective surfaces substantially forming a coaxial system with respect to an optical axis, wherein $A2=\theta 22/\theta 12$, $B2=\theta 32/\theta 12$, $2.4<A2<2.7$, and $2.8<B2<3.2$ are met, where $\theta 12$ is an angle on a predetermined plane between the optical axis and a principal ray that is exited from a center of an arc-shaped illuminated area on the object plane and incident upon the first reflective surface, $\theta 22$ is an angle on the predetermined plane between the optical axis and a principal ray that is exited from the center of the illumination area, reflected on the first reflective surface, and incident upon the second reflective surface, and, $\theta 31$ is an angle on the predetermined plane between the optical axis and a principal ray that is exited from the center of the illumination area, reflected on the second reflective surface, and incident upon the third reflective surface.

A projection optical system according to still another aspect of the present invention for projecting a pattern on an object plane onto an image plane includes first to sixth reflective surfaces in order to reflect light from the object plane, wherein $0.25<Le1/TT<0.285$, $0.175<Le2/TT<0.21$, and $0.1<Le3/TT<0.235$ are met, where TT is a distance between the object plane and the image plane, Le1 is an absolute value of an interval between a plane apex of the first reflective surface and that of the second reflective surface on an optical axis, Le2 is an absolute value of an interval between a plane apex of the second reflective surface and that of the third reflective surface on an optical axis, and Le3 is an absolute value of an interval between a plane apex of the third reflective surface and that of the fourth reflective surface on an optical axis.

An exposure apparatus according to another aspect of the present invention includes an illumination optical system for illuminating a pattern of an object plane using light from a light source, and the above projection optical system for projecting the pattern of the object plane onto an image plane.

A device manufacturing method according to another aspect of the present invention includes the steps of exposing a plate using the above exposure apparatus, and developing the plate that has been exposed.

Other objects and further features of the present invention will become readily apparent from the following description of the preferred embodiments with reference to the accompanying drawings.

BRIEF DESCRIPTION OF THE DRAWINGS

FIG. 14 is a view for explaining a spread radius of an irradiating area on the second to fourth reflective surfaces formed by the light emitted from a center of an arc-shaped illuminated area of the object plane.

DETAILED DESCRIPTION OF THE PREFERRED EMBODIMENTS

Figure 1:
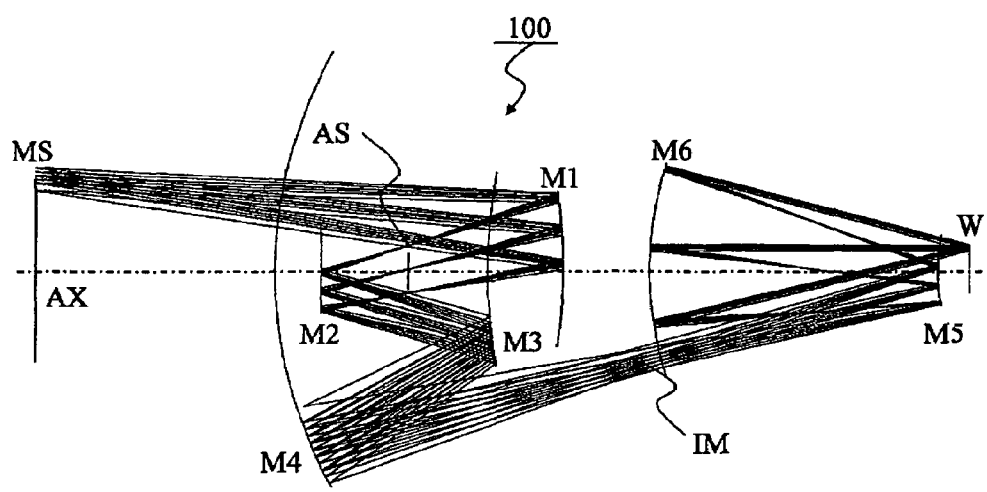
FIG. 1 is an optical path diagram showing a first embodiment of the present invention.

Referring now to FIGS. 1 to 7, a description will be given of an inventive catoptric reduction projection optical system 100 to 100F (while reference numeral 100 generalizes these reference numerals). The inventive catoptric reduction projection optical system is a catoptric projection optical system that reduces and projects a pattern of an object plane (MS), such as a mask plane, onto an image plane (W), such as a substrate plane and a plate plane to be exposed, and suitable for the EUV light (with a wavelength of, for example, 13.4 nm).

The projection optical system 100 includes six mirrors that substantially have, in order of reflecting the light from the object plane MS along the optical path, a first (concave) mirror M1, a second (convex) mirror M2, a third (convex) mirror M3, a fourth (concave) mirror M4, a fifth (convex) mirror M5, and a sixth (concave) mirror. Thus, the projection optical system 100 secures reflectance necessary for the entire optical system, prevents mechanical interference between the mask and the wafer, and increases the degree of freedom to correct the wavefront aberration.

An optical axis is defined as a line that connects respective centers of curvature six reflective surfaces of the six mirrors. However, the centers of curvature six reflective surfaces of the six mirrors are not always aligned with each other, and it is conceivable that the center of curvature of a predetermined mirror may slightly shift from the optical axis so as to correct the aberration etc. within 1% of the radius of the curvature of the mirror. When the mirror is not spherical but aspheric, the center of the curvature of the mirror means the center of curvature of the spherical surface as a base of the aspherics. The radius of curvature of the mirror also means that the radius of curvature of the spherical surface as a base of the aspherics. In other words, it is the center of curvature based on the curvature near the axis of the center of rotation of the reflective surface. When the reflective surface is spherical, all the lines that pass the center of this spherical surface become the axis of the center of ration, and may be any one of them.

The projection optical system 100 provides an aperture stop AS between the first and second reflective surfaces on the optical path. In general, the effective diameter of the sixth reflective surface becomes very large for a high NA, and it is necessary to significantly separate the fourth reflection surface from the optical axis so as to introduce the light to the fifth reflective surface so that the sixth reflective surface does not shield the light.

Figure 12A:
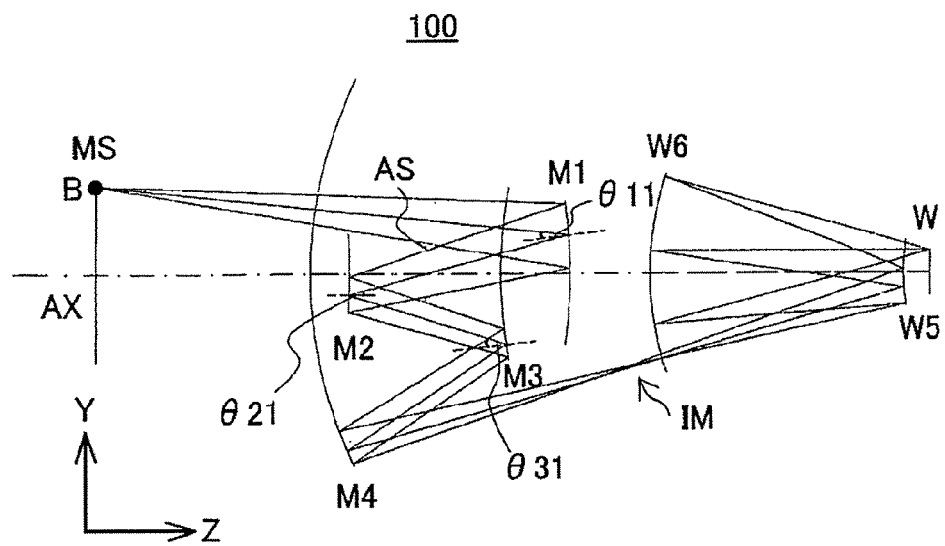
FIG. 12 is an optical path of a projection optical system as one aspect of the present invention.
Figure 12B:
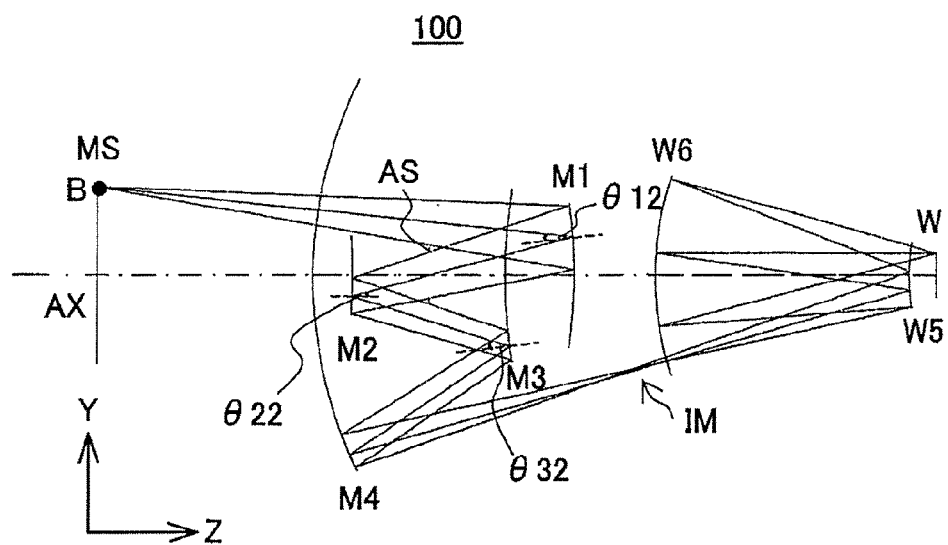

Referring now to FIGS. 12A and 12B, a description will be given of the incident angles of the second to fourth reflective surfaces. Here, FIGS. 12A and 12B are optical paths of the projection optical system 100.

Figure 11:
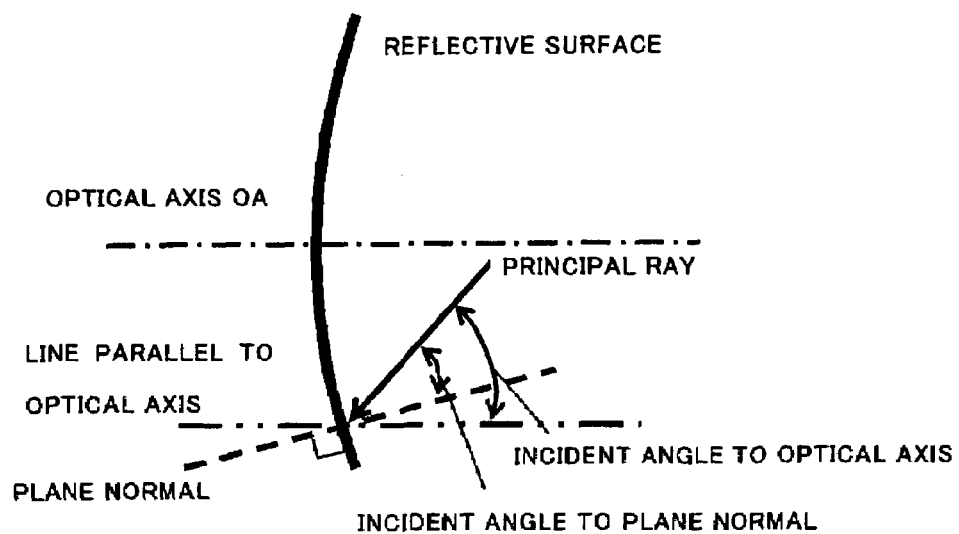
FIG. 11 is a view for explaining a light incident angle.

This embodiment defines the incident angles $\theta 11$, $\theta 21$ and $\theta 31$ as follows: The incident angle $\theta 11$ is an angle between a principal ray exiting from the center B and a plane normal of the first reflective surface. The incident angle $\theta 21$ is an angle between the principal ray and a plane normal of the second reflective surface. The incident angle $\theta 31$ is an angle between the principal ray and a plane normal of the third reflective surface. This embodiment satisfies $A1=\theta 21/\theta 11$, $B1=\theta 31/\theta 11$, $1.5<A1<1.65$ (more preferably $1.52<A1<1.59$), and $2.3<B1<2.5$ (more preferably $2.35<B1<2.46$). FIG. 11 defines the principal ray and the plane normal. FIG. 11 is an explanatory view of the incident angle to the plane normal and the incident angle to the optical axis. When these conditional equations lower the lower limits, the incident angle becomes too small. Then, an introduction of the light to a location apart from the optical axis becomes difficult, and effective parts of respective mirrors and aperture stop may overlap each other. When these conditional equations exceed the upper limits, the reflectance may not be obtained due to the characteristic of the multilayer coating. In addition, defines the incident angles $\theta 12$, $\theta 22$ and $\theta 32$ as follows: The incident angle $\theta 12$ is an angle between the principal ray exiting from the center B and the optical axis of the first reflective surface. The incident angle $\theta 22$ is an angle between the principal ray and the optical axis of the second reflective surface. The incident angle $\theta 32$ is an angle between the principal ray and the optical axis of the third reflective surface. For the similar reasons to the above, this embodiment preferably satisfies $A2=\theta 22/\theta 12$, $B2=\theta 32/\theta 12$, $2.4<A2<2.7$ (more preferably $2.45<A2<2.67$), and $2.8<B2<3.2$ (more preferably $2.85<B2<3.16$).

The incident angle $\theta 11$ between a principal ray exiting from the center B and a plane normal of the first reflective surface, the incident angle $\theta 21$ between the principal ray and a plane normal of the second reflective surface, and the incident angle $\theta 31$ between the principal ray and a plane normal of the third reflective surface preferably satisfy the following conditions:

$$9° < \theta 11 < 12° \qquad \text{[EQUATION 1]}$$

$$14.5° < \theta 21 < 18.5° \qquad \text{[EQUATION 2]}$$

$$23.5° < \theta 31 < 28° \qquad \text{[EQUATION 3]}$$

$$\theta 11 < \theta 21 < \theta 31 \qquad \text{[EQUATION 4]}$$

In addition, the incident angle $\theta 41$ between a principal ray exiting from the center B and a plane normal of the first reflective surface, the incident angle $\theta 51$ between the principal ray and a plane normal of the second reflective surface, and the incident angle $\theta 61$ between the principal ray and a plane normal of the third reflective surface preferably satisfy the following conditions:

$$7.5° < \theta 41 < 10° \qquad \text{[EQUATION 5]}$$

$$10.5° < \theta 51 < 13.5° \qquad \text{[EQUATION 6]}$$

$$3° < \theta 61 < 5.5° \qquad \text{[EQUATION 7]}$$

The incident angle $\theta 12$ between a principal ray exiting from the center B and the optical axis of the first reflective surface, the incident angle $\theta 22$ between the principal ray and the optical axis of the second reflective surface, and the incident angle $\theta 31$ between the principal ray and the optical axis of the third reflective surface preferably satisfy the following conditions:

$$4.5° < \theta 12 < 7° \qquad \text{[EQUATION 8]}$$

$$13.5° < \theta 22 < 17° \qquad \text{[EQUATION 9]}$$

$$15.5° < \theta 32 < 20° \qquad \text{[EQUATION 10]}$$

$$\theta 12 < \theta 22 < \theta 32 \qquad \text{[EQUATION 11]}$$

The incident angle $\theta 42$ between a principal ray exiting from the center B and the optical axis of the first reflective surface, the incident angle $\theta 52$ between the principal ray and the optical axis of the second reflective surface, and the incident angle $\theta 61$ between the principal ray and the optical axis of the third reflective surface preferably satisfy the following conditions:

$$31.5° < \theta 42 < 35° \qquad \text{[EQUATION 12]}$$

$$14.5° < \theta 52 < 18.5° \qquad \text{[EQUATION 13]}$$

$$6.5° < \theta 62 < 9.5° \qquad \text{[EQUATION 14]}$$

Preferably, the incident angle is smaller than 28° to obtain the high reflectance of the multilayer mirror, and the incident angles of M1, M2 and M3 should be gradually increased in this order to restrain the aberration without unnaturally abruptly deflecting the light.

Figure 13:
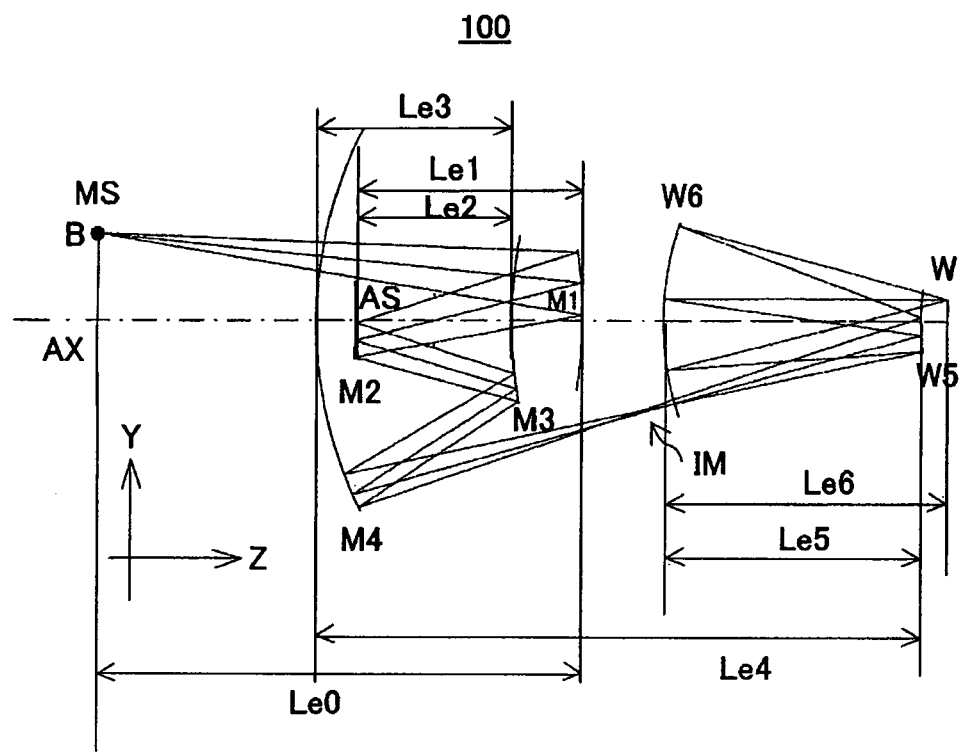
FIG. 13 is an optical path of a projection optical system as one aspect of the present invention.

Referring now to FIG. 12, a description will be given of an introduction of the light from the object point to the fourth reflective surface. Here, FIG. 13 is an optical path of the projection optical system 100. Referring to FIG. 13, it is preferable to increase that an absolute value Le1 of a plane apex interval between the first and second reflective surfaces is greater than an absolute value Le2 of a plane apex interval between the second and third reflective surfaces, and an absolute value Le3 of a plane apex interval between the third and fourth reflective surfaces. This is because when Le2 is greater than Le1, the third reflective surface is located close to the sixth reflective surface and an arrangement of the components becomes difficult. Taking this into account, when Le2 is smaller than Le1, Le3 is preferably smaller than Le1. This is because when Le3 is greater than Le1, the fourth reflective surface is located close to the object plane, and it becomes difficult to arrange the reticle stage and the deflecting mirror in the illumination optical system, etc. For the above reasons, the following conditional equations are preferably met:

$$0.25 < Le1/TT < 0.285 \qquad \text{[EQUATION 15]}$$

The lower limit is more preferably 0.256, or most preferably 0.260, and the upper limit is more preferably 0.280.

$$0.175 < Le2/TT < 0.21 \quad \text{[EQUATION 16]}$$

The lower limit is more preferably 0.178, and the upper limit is more preferably 0.205.

$$0.21 < Le3/TT < 0.235 \quad \text{[EQUATION 17]}$$

The lower limit is more preferably 0.214, and the upper limit is more preferably 0.230.

Assume that where TT is a distance between the object plane and the image plane. Le0 is an absolute value of a plane apex interval between the object plane and the first reflective surface on an optical axis. Le4 is an absolute value of a plane apex interval between the fourth reflective surface and the fifth reflective surface on an optical axis. Le5 is an absolute value of a plane apex interval between the fifth reflective surface and the sixth reflective surface on an optical axis. Le6 is an absolute value of a plane apex interval between the sixth reflective surface and the image plane on an optical axis $$0.555 < Le0/TT < 0.575 \quad \text{[EQUATION 18]}$$

The lower limit is more preferably 0.560, and the upper limit is more preferably 0.568.

$$0.685 < Le4/TT < 0.72 \quad \text{[EQUATION 19]}$$

The lower limit is more preferably 0.693, and the upper limit is more preferably 0.710.

$$0.295 < Le5/TT < 0.315 \quad \text{[EQUATION 20]}$$

The lower limit is more preferably 0.305, and the upper limit is more preferably 0.310.

$$0.33 < Le6/TT < 0.35 \quad \text{[EQUATION 21]}$$

The lower limit is more preferably 0.337, and the upper limit is more preferably 0.345.

With respect to the optical path of the light from the reticle pattern plane (object plane) to the image plane, the optical path from the second reflective surface to the third reflective surface does not intersect with that from the fourth reflective surface to the fifth reflective surface. This configuration avoids two or more surface each having a large effective diameter, and prevents the difficulty of the arrangement of components due to the complex optical path.

For easy processing and measurements, an absolute value of a radius of curvature of the second reflective surface is made 1800 mm or smaller, more preferably 1600 mm or smaller.

An intermediate image is formed between the fourth and fifth reflective surfaces. This configuration narrows the light near the sixth reflective surface having a large effective diameter, and effectively prevents light shielding. An intermediate image of the pattern is formed at a position that accords with none of the six reflective surfaces. An intermediate image of the pattern of the object plane is formed between two adjacent reflective surfaces on the optical path among the six reflective surfaces, and the intermediate image is apart from each of the two adjacent reflective surfaces by Lim×0.35 or greater, preferably, Lim×0.4 or greater, where Lim is an optical path length between the two adjacent reflective surfaces. This configuration can maintain an appropriate divergence of the light on the reflective surface, and reduce deteriorations of imaging performance on the reflective surface, caused by dust and ripples on the reflective surfaces, bubbles in the mirror material, etc.

The light from the object plane MS to the first mirror M1 is set non-telecentric, and the exit light at the image plane side is set telecentric. Since an additionally provided illumination optical system illuminates the mask on the object plane MS and the image is formed on the wafer on the image plane W, a certain incident angle is vital at the object side. On the other hand, the image plane side is preferably telecentric to reduce magnification variance even when the wafer W arranged on the image plane moves in the optical axis direction.

The projection optical system 100 is arranged substantially as a coaxial optical system that is axially symmetrical around one optical axis, so as to correct an aberration for only a narrow arc-shape image field around the optical axis. More specifically, the six reflective surfaces in the projection optical system 100 have substantially rotationally symmetrical shape around substantially one common optical axis. Here, that the six reflective surfaces have substantially rotationally symmetrical shape does not necessarily mean that the six reflective surfaces have perfectly rotationally shapes and the reflective surface may have a non-rotationally symmetrical shape. In other words, each reflective surface may constitute part of a rotationally symmetrical surface around a common (optical) axis, and the common (rotationally symmetrical) axis of each reflective surface may be a common axis to each other. A plane apex of each reflective surface means a nodal point between the reflective surface and the common axis or the optical axis. Each reflective surface does not have to actually exist. The plane apex of the reflective surface is referred to as one of a pair of nodal points between a spherical surface as a base of each reflective surface (when the reflective surface is the spherical surface, the spherical surface itself) which is complemented throughout part where the reflective surface does not exist, and the rotationally symmetrical axis or the above common axis or optical axis of the reflective surface. The one of the pair of nodal points is the closest nodal point to a position at which each reflective surface exists. However, the six mirrors do not have to be arranged perfectly coaxial for aberrational corrections or adjustments. For example, they may be slightly decentered for improvements of aberrations or the degree of freedom in arrangement.

Preferably, the fifth and sixth mirrors (M5) and (M6) are convex and concave mirrors, respectively, for imaging with a high NA and maintained back focus. Here, the "back focus" means an interval between the surface closest to the image plane and the image plane (W). It is preferable that the first reflective surface has a concave shape for convergence of the divergent light from the mask and easy deflection of the light. It is also preferable that the fourth reflective surface has a concave shape, so as to introduce the light into the fifth reflective surface close to the optical axis while avoiding the sixth reflective surface having a large effective diameter. In addition, since all the reflective surfaces are included between the object plane and the image plane, an arrangement of the reticle stage and the wafer stage can easily arranged. Moreover, the all of the optical elements having powers are arranged between the object plane and the image plane.

In addition to providing the aperture stop between the first and second reflective surfaces, the second and third reflective surfaces each have a convex shape. This configuration can gradually and easily introduce the light from the aperture stop to the fourth reflective surface via two reflective surfaces, preventing an extremely great distance between the third and fourth reflective surfaces. This provides a system that has a relatively small maximum effective diameter, and can reduce the enlargement of the fourth reflective surface while keeping the incident angle small. Moreover, the properly enlarged front focus (that is a distance from the object plane to the fourth reflective surface in this embodiment) facilitates an arrangement of components.

In order to form a system having a comparatively small incident angle, a comparatively small maximum effective diameter, and a sufficient front focus, it is preferable that L1 and L2 satisfy the following equations. Here, L1 is an interval between the object plane and the reflective surface closest to the object plane (which is, but not limited to, a distance between the object plane and the fourth reflective surface in this embodiment, and may be a distance between the object plane and the second reflective surface or a distance between the object plane and the reflective surface other than the second and fourth reflective surfaces). L2 is an interval between the reflective surface closest to the object plane and the first reflective surface.

$$0.75 < L1/L2 < 1.25 \quad \text{[EQUATION 22]}$$

More preferably, the following equation is met:

$$0.80 < L1/L2 < 1.20 \quad \text{[EQUATION 23]}$$

Most preferably, one of the following equations is met:

$$0.81 < L1/L2 < 0.84 \quad \text{[EQUATION 24]}$$

$$0.87 < L1/L2 < 0.94 \quad \text{[EQUATION 25]}$$

A small object-side telecentricity is needed when the imaging performance deteriorates caused by influence of the oblique incidence upon the mask. In this case, when the second reflective surface accords with the aperture stop surface, the light incident upon the first reflective surface from the object plane is shielded on the second reflective surface. The projection optical system 100 arranges the stop between the first and second reflective surfaces, and is less likely to cause the above problem.

When the divergence of the light on the reflective surface is small, the ripples on the mirror surface that occur at the time of processing and the air bubbles in the mirror materials directly affect the deteriorations of the imaging performance, and the energy concentration deforms a mirror and transfers dust. Accordingly, a difference is 30 mm or longer, more preferably, 40 mm or longer (although an extremely great value makes a processing measurement impossible), between a maximum distance and a minimum distance between an optical axis and a light incident area on the fourth reflective surface, upon which light emitted from the center B is incident. The center B is a center of a nodal line formed between a plane that includes a center of an arc illuminated area (i.e., a center of gravity or a center point on the center line in a circumference direction of the arc shape) on the object plane and the optical axis, and the illuminated area. Since a distance between the third and fourth reflective surfaces is comparatively small, the divergent light on the fourth reflective surface narrows. However, the convex shapes of the second and third reflective surfaces enable properly spread light to be incident upon each reflective surface and maintain an appropriate divergence of the light on the fourth reflective surface.

Where r1 to r6 are radii of curvature of respective mirrors, the sum of Petzval terms should be zero or nearly zero as in Equations 26 and 27 below:

$$\frac{1}{r_1} - \frac{1}{r_2} + \frac{1}{r_3} - \frac{1}{r_4} + \frac{1}{r_5} - \frac{1}{r_6} \approx 0 \quad \text{[EQUATION 26]}$$

$$\frac{1}{r_1} - \frac{1}{r_2} + \frac{1}{r_3} - \frac{1}{r_4} + \frac{1}{r_5} - \frac{1}{r_6} = 0 \quad \text{[EQUATION 27]}$$

While the projection optical system 100 includes six mirrors, at least one or more mirrors may have an aspheric surface whose shape is defined in Equation 28 as a general formula below. As a mirror having an aspheric surface advantageously facilitates a correction of aberration, the aspheric surface is preferably applied to many possible (desirably, six) mirrors.

$$Z = \frac{ch^2}{1 + \sqrt{1 - (1+k)c^2 h^2}} + Ah^4 + Bh^6 + Ch^8 + \quad \text{[EQUATION 28]}$$
$$Dh^{10} + Eh^{12} + Fh^{14} + Gh^{16} + Hh^{18} + Jh^{20} + \ldots$$

where "Z" is a coordinate in an optical-axis direction, "c" is a curvature (i.e., a reciprocal number of the radius r of curvature), "h" is a height from the optical axis, "k" is a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

A multilayer coating for reflecting the EUV light is applied to the respective mirrors, and intensifies the light. An applicable multilayer coating for reflecting the EUV light below 20 nm is, for example, a Mo/Si multilayer coating created by reciprocally laminating a molybdenum (Mo) layer and a silicon (Si) layer or a Mo/Be multilayer coating created by reciprocally laminating a molybdenum (Mo) layer and a beryllium (Be) layer. An optimal material is selected according to wavelengths to be used. Of course, the present invention does not limit the multilayer coating to the above materials, and may use any multilayer coating that has an effect similar to the above effect.

In general, a comparatively small distribution width of an incident angle is necessary for a high reflectance in view of the characteristics of the multilayer coating, when the maximum value of the incident angle is large, although a comparatively large distribution width of the incident angle is permissible when the maximum value of the incident angle is small. It is the convex third surface that has the largest incident angle among the six reflective surfaces, and it is preferable that the convergent light is incident upon the third reflective surface and the divergent light emits from it. This third reflective surface is likely to reduce the reflectance irrespective of a relatively small incident angle. Accordingly, the projection optical system 100 maintains the reflectance by setting the incident angle characteristic upon the third reflective surface as follows, where $\theta_{max}$ is the maximum incident angle upon the third reflective surface, and $\Delta\theta$ is a difference between the maximum incident angle and the minimum incident angle on the third reflective surface, or an incident angle distribution width:

$$25° < \theta_{max} + \Delta\theta < 35° \quad \text{[EQUATION 29]}$$

$$28° < \theta max + \Delta\theta \quad \text{[EQUATION 30]}$$

and/or $$\theta max + \Delta\theta < 32° \quad \text{[EQUATION 31]}$$

$$\theta max + \Delta\theta < 30° \quad \text{[EQUATION 32]}$$

None of the six reflective surfaces have an area that allows the light to pass through, absorbs the light or transmits the light, within their light incident areas. In this embodiment, the light incident area on each reflective surface does not have an opening, etc. With respect to the light to a plate to be exposed (i.e., a wafer), or the light from the sixth reflective surface to the plate (image plane), an area that does not include the light is eliminated from an outer circumference on a section orthogonal to the optical axis. In general, the pupil is not shielded. When a pupil is shielded, the imaging performance is remarkably deteriorated.

The convergent light enters the convex third reflective surface from the second reflective surface, and the divergent light enters the fourth reflective surface from the convex third reflective surface. The instant embodiment provides such characteristics that the maximum incident angle in a light incident effective area at respective points in a radial direction (orthogonal to the optical axis) on the third reflective surface has a maximum value at the effective region, thereby making the incident angle distribution width relatively small and preventing deteriorations of the performance of the multilayer coating. More specifically, on the third reflective surface, there is an extreme of a maximum incident angle at each point on a nodal line in a region between Lmin+0.3×(Lmax−Lmin) and Lmax on the nodal line. The nodal line is formed between a light incident area upon which the light is incident from an arc-shaped illuminated area on the object plane, and a plane that contains a center point of a chord of the arc-shaped illuminated area shape on the object plane and the optical axis. Lmin is a minimum distance from the optical axis to each point on the nodal line. Lmax is a maximum distance from the optical axis to each point on the nodal line. More preferably, the maximum incident angle at each point has an extreme value on the nodal line in a region between (Lmin+Lmin)/2±0.2×(Lmax−Lmin) on the nodal line.

A plane apex is defined, with respect to each reflective surface, as one of nodal points between the optical axis and an approximately spherical surface that has a center as a center of curvature of each reflective surface and a radius as a radius of curvature of each reflective surface, which one is closest to a reflection point of the light on each reflective surface. The plane apexes of the six reflective surfaces are arranged in order of the fourth reflective surface, the second reflective surface, the third reflective surface, the first reflective surface, the sixth reflective surface, and the fifth reflective surface in order from the object plane to the image plane along an optical axis.

As the plane interval becomes small, it is difficult to maintain a thickness of the mirror and to arrange components, such as a holder mechanism and a cooling mechanism. Thus, a distance is made 250 mm or longer, preferably 310 mm or longer, between the object plane and one of the plane apexes of the six reflective surfaces, which one is closest to the object plane. A distance on the optical axis between the plane apex of the second reflective surface and the plane apex of the fourth reflective surface is set to 5 mm or longer, preferably 10 mm or longer, more preferably 15 mm or longer. Preferably, the following equation is met, where La11 is a distance between the object plane and the image plane on the optical axis, and L24 is an interval between the plane apex of the second reflective surface and the plane apex of the fourth reflective surface:

$$La11/200 < L24 < La11/10 \quad \text{[EQUATION 33]}$$

More preferably, at least one of the following equations is met:

$$La11/100 < L24 \quad \text{[EQUATION 34]}$$

$$L24 < La11/18 \quad \text{[EQUATION 35]}$$

The sixth reflective surface has a generally large effective diameter and thus a large thickness. An easy configuration is set to 100 mm or longer, preferably 110 mm or longer, more preferably 115 mm or longer, when an interval on the optical axis between the plane apex of the sixth reflective surface and the plane apex of the reflective surface closest to the sixth reflective surface.

Preferably, the following conditions are met, are met, where La11 is an overall length of the projection optical system, and L6 is an interval between the plane apex of the sixth reflective surface and the plane apex of the reflective surface that is closest to the sixth reflective surface:

$$La11/20 < L6 < La11/6 \quad \text{[EQUATION 36]}$$

$$La11/12 < L6 \quad \text{[EQUATION 37]}$$

and/or $$L6 < La11/9 \quad \text{[EQUATION 38]}$$

Preferably, the third reflective surface is located closer to the object plane along the optical path than the sixth reflective surface, or the third reflective surface is located closer to the object plane the sixth reflective surface. The aperture stop is preferably closest to the second reflective surface among the six reflective surfaces with respect to a distance along the optical path.

The aperture stop is apart from each of the first and second reflective surfaces by Lst/10 or greater, preferably by Lst/5 or greater, where Lst is an optical path length between the first and second reflective surfaces. This configuration can easily introduce the light from the second reflective surface the fourth reflective surface.

In order to improve the throughput, it is effective to widen the arc-shaped illuminated area. In order to maximize the use of light from the light source and in view of the currently demanded light source specification, the arc-shape field needs a width W of 3.5 mm or greater when the projection optical system has an NA of 0.2 to 0.4. As the width becomes excessively large, the aberrational correction of the projection optical system becomes difficult. Thus, the width is preferably set to 8 mm or smaller, more preferably between 4 mm and 6 mm. In addition, the NA and the width of the arc-shaped field preferably satisfy the following condition:

$$NA > 0.36/(W+1.5)+0.165 \quad \text{[EQUATION 39]}$$

Referring now to FIGS. 1 to 10, a description will be given of the projection optical system 100.

First Embodiment

A description will be given of a first embodiment of the present invention with reference to FIG. 1 and Table 1.

A projection optical system 100 of the first embodiment includes six mirrors that basically includes, in order of reflecting the light from the object plane MS, a first concave reflective surface M1, an aperture stop, a second convex reflective surface M2, a third convex reflective surface M3, a fourth concave surface M4, a fifth convex reflective surface M5, and a sixth concave reflective surface M6. The projection optical system 100 forms an intermediate image IM between M4 and M5 on the optical path, and re-forms the intermediate image IM on the image plane W using the remaining surfaces. The unit of the radius of curvature and plane interval is [mm] in Table 1. In FIG. 1, an alternate long and short dash line denotes an optical axis, which can also defined as a line that connects centers of curvature of the first to sixth reflective surfaces.

A distance between the object plane and the image plane on the optical axis or an overall length is about 1252.384 mm in the first embodiment. MS is a reflection mask placed at an object plane position, and W is a wafer placed at an image plane position. The inventive catoptric reduction projection optical system projects a reflection mask illuminated by the illumination optical system onto the wafer as the image plane. An image-side numerical aperture NA is 0.25, a magnification is ¼, and an object point is 119 to 139 mm (while the image side has an arc field with a width of 5 mm). The wavefront aberration has a RMS of 17.4 mλ, and a static distortion range of 2.7 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point with an object point of 129 mm has a width of 45.2 mm in the direction perpendicular to the optical axis. This configuration reduces influences of the mirror surface's ripples, air bubbles in the mirror material, mirrors' deformations, dust transfers, etc. due to the energy concentration, and prevents deteriorations of the imaging performance, while maintaining the maximum effective diameter to be 585 mm.

Preferably, the aperture stop is distant from the first and second reflective surfaces M1 and M2 by a proper distance. In this embodiment, the aperture stop is distant from the first reflective surface M1 by 0.654 Lst, and from the second reflective surface M1 by 0.346 Lst, where Lst is an optical path length between the first and second reflective surfaces.

The third reflective surface is a surface that has the largest light incident angle among the six reflective surfaces, which is 27°. The incident angle distribution width is 4.4°. In particular, the small incident angle distribution prevents reductions of the reflectance due to the multilayer coating.

A distance is 321.9 mm between the object plane and the plane apex of the fourth reflective surface as a reflective surface closest to the object plane, providing a sufficient front focus. An interval is 61.4 mm between the plane apex of the second reflective surface and the plane apex of the fourth reflective surface, and an interval is 116 mm between the plane apex of the sixth reflective surface and the plane apex of the first reflective surface as a reflective surface that is closest to the sixth reflective surface. This configuration maintains a thickness of each mirror and the space for various mechanisms, such as an adjusting mechanism and a cooling mechanism. L1/L2 is 0.830, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and maintain an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim, where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 25.1° and less likely to cause an increase of an aberration and a decrease of the reflectance on the multilayer coating. In addition, since the incident angle gradually increases in order of M1, M2 and M3, the light from the object plane can be introduced to M4 without shielding. The incident angles upon the other planes are determined similarly. Each incident angle upon a plane normal on each surface is as follows: θ11=10.4°. θ21=16.0°. θ31=25.1°. θ41=8.6°. θ51=11.9°. θ61=4.0°. Each incident angle upon the optical axis on each surface is as follows: θ12=5.9°. θ22=14.9°. θ32=17.2°. θ42=32.9°. θ52=15.7°. θ62=8.0°.

Referring now to FIGS. 14A to 14C, a detailed description will be given of the center of the arc-shaped illuminated area on the object plane. Here, FIG. 14A is an optical path of the projection optical system 100. FIG. 14B is a schematic perspective view for explaining the arc-shaped illuminated area on the object plane. FIG. 14C is an enlarged plane view of the arc-shaped illuminated area.

Referring to FIGS. 14A to 14C, the arc-shaped illuminated area AIR on the object plane MS is defined as an area by moving an arc AC by a predetermined distance D along a perpendicular bisector PB of a chord C depicted by a broken line in FIG. 14B. The center B of the illuminated area AIR is a nodal point between the perpendicular bisector PB and an area by moving the arc AC by a predetermined distance D/2 along the perpendicular bisector PB of a chord C. Assume that an XYZ coordinate is set as shown in FIG. 14B, the perpendicular bisector PB accords with the Y-axis, an origin O is a center of curvature of the arc AC, and a coordinate is (0, R, 0) at which the lower arc AC of the illuminated area AIR intersects with the Y-axis. Then, the center B has a coordinate of (0, R+D/2, 0). In other words, the center B is a middle point of a segment LS at which a plane P intersects with the illuminated area AIR, where the plane P includes the center of gravity G or the origin O and the optical axis AX (which is a plane that includes the perpendicular bisector PB and the optical axis AX or the paper plane shown in FIG. 14A or the YZ plane in FIG. 14B).

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.261. Le2/TT=0.179. Le3/TT=0.229. Le0/TT=0.567. Le4/TT=0.709. Le5/TT=0.307. Le6/TT=0.341.

TABLE 1

| MIRROR NUMBER | RADIUS OF CURVATURE | PLANE APEX |
|---|---|---|
| M(MASK) | 0 | 709.84800 |
| M1 | −706.52400 | −213.48700 |
| APERTURE | 0 | −112.96900 |
| M2 | −1500.00000 | 224.72300 |
| M3 | 700.00000 | −286.16900 |
| M4 | 620.33200 | 888.54800 |
| M5 | 323.10900 | −384.64500 |
| M6 | 462.76200 | 426.53500 |
| W(WEFAR) | 0 | 0 |

ASPHERIC COEFFICIENT

| | K | A | B | C | D | E | F | G |
|---|---|---|---|---|---|---|---|---|
| M1 | −1.74858E+00 | 9.23055E−10 | −2.11112E−14 | 6.26883E−19 | −5.13981E−23 | 4.93156E−27 | −2.75614E−31 | 6.38279E−36 |
| M2 | 1.34777E+01 | −2.39736E−09 | 5.46835E−14 | 1.12216E−17 | −9.34360E−21 | 3.73946E−24 | −7.55884E−28 | 6.15488E−32 |
| M3 | 1.03737E+00 | −2.27691E−09 | −8.91005E−14 | 1.17202E−17 | −8.81984E−22 | 4.05103E−26 | −1.04360E−30 | 1.15546E−35 |
| M4 | −2.54829E−02 | 8.94333E−11 | −2.34462E−15 | 2.18505E−20 | 1.61745E−26 | −2.39650E−30 | 2.05917E−35 | −5.87149E−41 |
| M5 | 3.42381E−01 | −7.90071E−10 | 1.15783E−12 | −8.04750E−17 | 5.00002E−20 | −2.80048E−23 | 8.24008E−27 | −9.64674E−31 |
| M6 | 3.48259E−02 | 3.52475E−11 | 2.12796E−16 | 1.57268E−21 | −5.5012E−27 | 1.06617E−31 | 8.17667E−36 | −1.98359E−40 |

Second Embodiment

Figure 2:
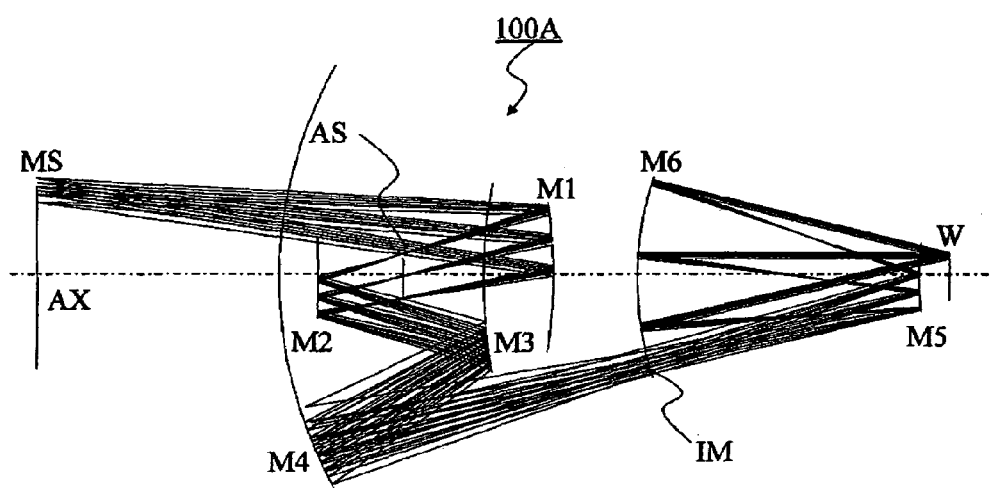
FIG. 2 is an optical path diagram showing a second embodiment of the present invention.

A description will be given of a projection optical system 100A according to a second embodiment of the present invention with reference to FIG. 2 and Table 2. Unless otherwise specified, this embodiment is similar to the first embodiment. The overall length of the second embodiment is about 1267.046 mm. An image-side numerical aperture NA is 0.237, a magnification is ¼, and an object point is 117.5 to 140.5 mm (while the image side has an arc field with a width of 5.75 mm). The wavefront aberration has a RMS of 17.6 mλ, and a static distortion range of 1.5 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 45.5 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 585 mm.

Preferably, the aperture stop is distant from the first and second reflective surfaces M1 and M2 by a proper distance. In this embodiment, the aperture stop is distant from the first reflective surface M1 by 0.656 Lst, and from the second reflective surface M1 by 0.344 Lst, where Lst is an optical path length between the first and second reflective surfaces.

The third reflective surface is a surface that has the largest light incident angle among the six reflective surfaces, which is 27°. The incident angle distribution width is 4.8°. The small incident angle distribution prevents reductions of the reflectance due to the multilayer coating.

A distance is 336.6 mm between the object plane and the plane apex of the fourth reflective surface as a reflective surface closest to the object plane, providing a sufficient front focus. An interval is 52.6 mm between the plane apex of the second reflective surface and the plane apex of the fourth reflective surface, and an interval is 116 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.888, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 24.8° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: $\theta 11$=10.3°. $\theta 21$=15.8°. $\theta 31$=24.8°. $\theta 41$=8.6°. $\theta 51$=11.7°. $\theta 61$=3.9°. Each incident angle upon the optical axis on each surface is as follows: $\theta 12$=5.9°. $\theta 22$=14.7°. $\theta 32$=16.9°. $\theta 42$=32.7°. $\theta 52$=15.5°. $\theta 62$=7.8°.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.258. Le2/TT=0.182. Le3/TT=0.223. Le0/TT=0.564. Le4/TT=0.701. Le5/TT=0.310. Le6/TT=0.343.

reflective surface M1 by 0.659 Lst, and from the second reflective surface M1 by 0.341 Lst, where Lst is an optical path length between the first and second reflective surfaces.

The third reflective surface is a surface that has the largest light incident angle among the six reflective surfaces, which is 27°. The incident angle distribution width is 4.9°. The small incident angle distribution prevents reductions of the reflectance due to the multilayer coating.

A distance is 340.8 mm between the object plane and the plane apex of the fourth reflective surface as a reflective

TABLE 2

| MIRROR NUMBER | RADIUS OF CURVATURE | PLANE APEX |
|---|---|---|
| M(MASK) | 0 | 715.81900 |
| M1 | −716.12100 | −214.26900 |
| APERTURE | 0 | −112.38900 |
| M2 | −1500.00000 | 230.03000 |
| M3 | 700.00000 | −282.61400 |
| M4 | 618.19100 | 888.36900 |
| M5 | 328.80000 | −393.12700 |
| M6 | 471.62300 | 435.12700 |
| W(WEFAR) | 0 | 0 |

ASPHERIC COEFFICIENT

| | K | A | B | C | D | E | F | G |
|---|---|---|---|---|---|---|---|---|
| M1 | −1.71111E+00 | 9.12114E−10 | −2.08677E−14 | 5.53638E−19 | −3.84470E−23 | 3.63512E−27 | −1.99427E−31 | 4.40002E−36 |
| M2 | 1.89149E+01 | −2.33866E−09 | 5.14450E−14 | 1.55157E−17 | −1.21994E−20 | 4.85447E−24 | −9.95274E−28 | 8.27121E−32 |
| M3 | 1.14144E+00 | −2.26421E−09 | −9.14399E−14 | 1.17075E−17 | −8.65006E−22 | 3.90349E−26 | −9.88059E−31 | 1.07411E−35 |
| M4 | −2.53894E−02 | 7.08547E−11 | −2.04123E−15 | 1.92894E−20 | 1.31597E−26 | −2.17749E−30 | 1.91061E−35 | −5.55658E−41 |
| M5 | 4.85584E−01 | −1.05702E−09 | 1.10386E−12 | −3.98425E−17 | 1.35295E−20 | −8.97234E−24 | 2.59639E−27 | −2.44935E−31 |
| M6 | 1.86590E−02 | 5.28168E−11 | 2.79824E−16 | 1.75250E−21 | 9.21551E−27 | −1.04462E−30 | 5.23515E−35 | −8.18886E−40 |

Third Embodiment

Figure 3:
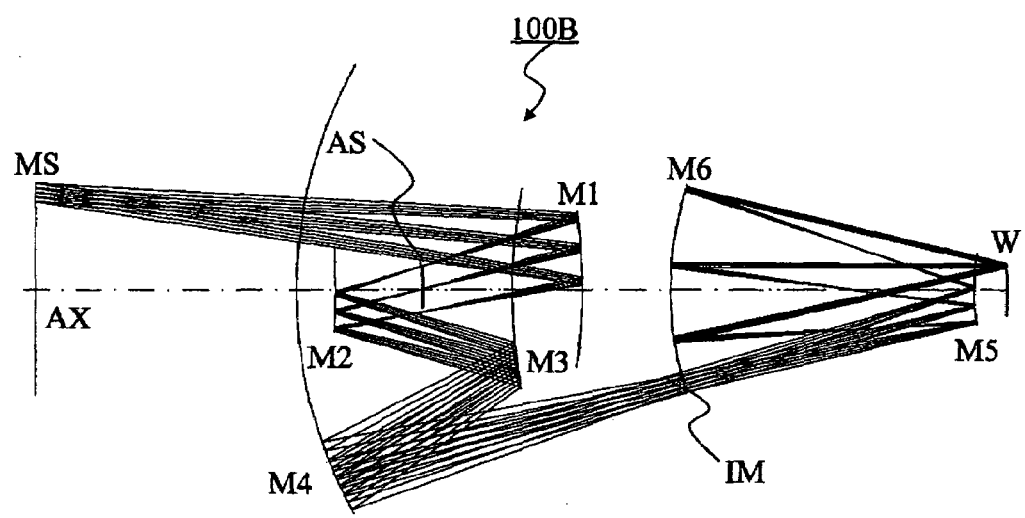
FIG. 3 is an optical path diagram showing a third embodiment of the present invention.

A description will be given of a projection optical system 100B according to a third embodiment of the present invention with reference to FIG. 3 and Table 3. Unless otherwise specified, this embodiment is similar to the first and second embodiments. The overall length of the third embodiment is about 1268.513 mm. An image-side numerical aperture NA is 0.23, a magnification is ¼, and an object point is 117 to 141 mm (while the image side has an arc field with a width of 6 mm). The wavefront aberration has a RMS of 17.0 m$\lambda$, and a static distortion range of 3.0 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 45.0 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 585 mm.

Preferably, the aperture stop is distant from the first and second reflective surfaces M1 and M2 by a proper distance. In this embodiment, the aperture stop is distant from the first surface closest to the object plane, providing a sufficient front focus. An interval is 50.7 mm between the plane apex of the second reflective surface and the plane apex of the fourth reflective surface, and an interval is 116 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.907, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 24.7° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: θ11=10.3°. θ21=15.8°. θ31=24.7°. θ41=8.5°. θ51=11.6°. θ61=3.9°. Each incident angle upon the optical axis on each surface is as follows: θ12=5.9°. θ22=14.6°. θ32=16.9°. θ42=32.6°. θ52=15.5°. θ62=7.8°.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.256. Le2/TT=0.183. Le3/TT=0.223. Le0/TT=0.565. Le4/TT=0.698. Le5/TT=0.311. Le6/TT=0.344.

More specifically, the divergence of the light on the fourth surface introduced from the object point of 126.75 mm is 42.4 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 550 mm.

Preferably, the aperture stop is distant from the first and second reflective surfaces M1 and M2 by a proper distance. In this embodiment, the aperture stop is distant from the first reflective surface M1 by 0.660 Lst, and from the second reflective surface M1 by 0.340 Lst, where Lst is an optical path length between the first and second reflective surfaces.

The third reflective surface is a surface that has the largest light incident angle among the six reflective surfaces, which is 26.9°. The incident angle distribution width is 2.59°. The small incident angle distribution prevents reductions of the reflectance due to the multilayer coating.

TABLE 3

| MIRROR NUMBER | RADIUS OF CURVATURE | PLANE APEX |
|---|---|---|
| M(MASK) | 0 | 716.58300 |
| M1 | −717.61400 | −214.40900 |
| APERTURE | 0 | −110.70300 |
| M2 | −1500.00000 | 231.76600 |
| M3 | 700.00000 | −282.46700 |
| M4 | 617.60500 | 885.74300 |
| M5 | 329.40000 | −393.92900 |
| M6 | 472.31400 | 435.92900 |
| W(WEFAR) | | |

ASPHERIC COEFFICIENT

| | K | A | B | C | D | E | F | G |
|---|---|---|---|---|---|---|---|---|
| M1 | −1.74713E+00 | 8.94795E−10 | −2.08679E−14 | 5.70246E−19 | −4.28929E−23 | 4.19048E−27 | −2.30821E−31 | 5.03221E−36 |
| M2 | 2.23191E+01 | −2.26707E−09 | 5.76002E−14 | 1.44486E−17 | −1.25019E−20 | 5.24338E−24 | −1.11928E−27 | 9.61434E−32 |
| M3 | 1.15153E+00 | −2.24786E−09 | −9.21410E−14 | 1.17375E−17 | −8.63698E−22 | 3.88096E−26 | −9.77901E−31 | 1.05773E−35 |
| M4 | −2.50634E−02 | 6.85004E−11 | −1.99900E−15 | 1.90076E−20 | 1.20330E−26 | −2.14854E−30 | 1.89674E−35 | −5.54395E−41 |
| M5 | 4.77515E−01 | −1.01282E−09 | 1.10973E−12 | −4.38480E−17 | 2.22619E−20 | −1.55145E−23 | 4.68958E−27 | −4.86211E−31 |
| M6 | 1.88278E−02 | 5.25050E−11 | 2.76702E−16 | 1.46126E−21 | 4.71248E−26 | −3.74731E−30 | 1.49207E−34 | −2.17320E−39 |

Fourth Embodiment

Figure 4:
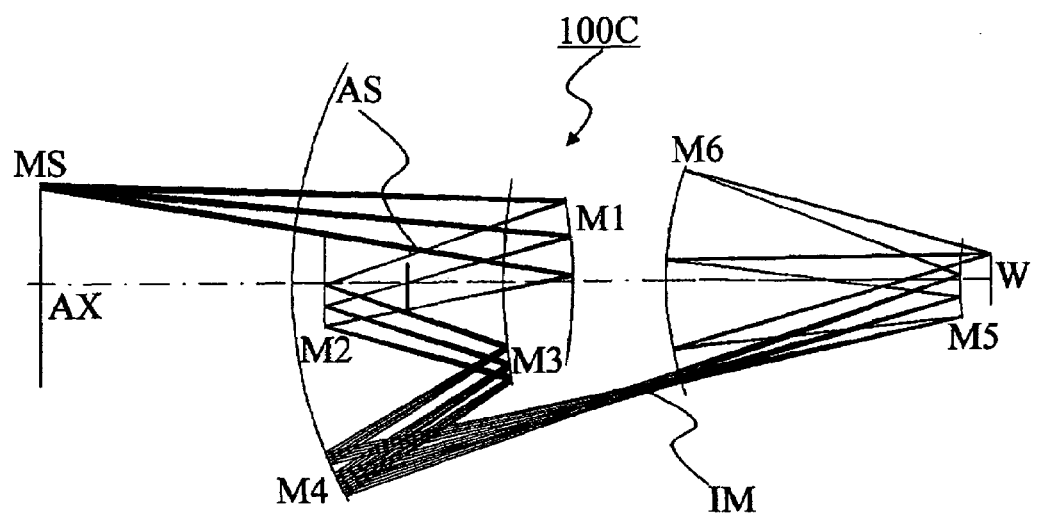
FIG. 4 is an optical path diagram showing a fourth embodiment of the present invention.

A description will be given of a projection optical system 100C according to a fourth embodiment of the present invention with reference to FIG. 4 and Table 4. Unless otherwise specified, this embodiment is similar to the first to third embodiments. The overall length of the fourth embodiment is about 1197.8 mm. An image-side numerical aperture NA is 0.28, a magnification is ¼, and an object point is 122.75 to 130.75 mm (while the image side has an arc field with a width of 2 mm). The wavefront aberration has a RMS of 14.3 mλ, and a static distortion range of 3.0 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

A distance is 317.5 mm between the object plane and the plane apex of the fourth reflective surface as a reflective surface closest to the object plane, providing a sufficient front focus. An interval is 42.0 mm between the plane apex of the second reflective surface and the plane apex of the fourth reflective surface, and an interval is 118 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.899, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 26.1° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: $\theta 11=10.8°$. $\theta 21=17.0°$. $\theta 31=26.1°$. $\theta 41=8.8°$. $\theta 51=11.9°$. $\theta 61=4.2°$. Each incident angle upon the optical axis on each surface is as follows: $\theta 12=5.9°$. $\theta 22=15.7°$. $\theta 32=18.3°$. $\theta 42=33.9°$. $\theta 52=16.3°$. $\theta 62=7.5°$.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.260. Le2/TT=0.187. Le3/TT=0.222. Le0/TT=0.560. Le4/TT=0.702. Le5/TT=0.309. Le6/TT=0.342.

of 1.5 mm). The wavefront aberration has a RMS of 13.6 m$\lambda$, and a static distortion range of 3.0 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129.8 mm is 49.0 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 560 mm.

Preferably, the aperture stop is distant from the first and second reflective surfaces M1 and M2 by a proper distance. In the instant embodiment, the aperture stop is distant from the first reflective surface M1 by 0.653 Lst, and from the second reflective surface M1 by 0.347 Lst, where Lst is an optical-path length between the first and second reflective surfaces.

The third reflective surface is a surface that has the largest light incident angle among the six reflective surfaces, which is 27°. The incident angle distribution width is 2.06°. The small incident angle distribution prevents reductions of the reflectance due to the multilayer coating.

TABLE 4

| MIRROR NUMBER | RADIUS OF CURVATURE | PLANE APEX |
|---|---|---|
| M(MASK) | 0 | 670.591 |
| M1 | −659.491 | −205.272 |
| APERTURE | 0 | −105.9 |
| M2 | −1352.71 | 224.219 |
| M3 | 735.115 | −266.188 |
| M4 | 592.799 | 841.344 |
| M5 | 298.557 | −370.205 |
| M6 | 443.971 | 409.205 |
| W(WEFAR) | 0 | 0 |

ASPHERIC COEFFICIENT

| | K | A | B | C | D | E | F | G |
|---|---|---|---|---|---|---|---|---|
| M1 | −1.90456 | 1.14998E−09 | −3.19290E−14 | 9.24465E−19 | −4.64961E−23 | 3.11869E−27 | −1.51805E−31 | 3.40228E−36 |
| M2 | 3.80306 | −2.58172E−09 | 8.59253E−14 | −9.08083E−18 | 2.26366E−21 | 1.71212E−26 | −1.12695E−28 | 1.52306E−32 |
| M3 | 1.03203 | −2.24027E−09 | −7.30454E−14 | 1.13603E−17 | −9.39592E−22 | 4.59950E−26 | −1.23588E−30 | 1.40753E−35 |
| M4 | −0.03503 | 4.40265E−11 | −1.93230E−15 | 2.51443E−20 | −2.81580E−26 | −3.13819E−30 | 3.37014E−35 | −1.12233E−40 |
| M5 | −0.21853 | 3.15240E−10 | 1.68411E−12 | −1.26167E−16 | 5.19924E−20 | −2.12913E−23 | 5.31435E−27 | −5.68060E−31 |
| M6 | 0.00357 | 8.17612E−11 | 4.90594E−16 | 2.08139E−21 | 6.15332E−26 | −1.96376E−30 | 4.65098E−35 | −4.71272E−40 |

Fifth Embodiment

Figure 5:
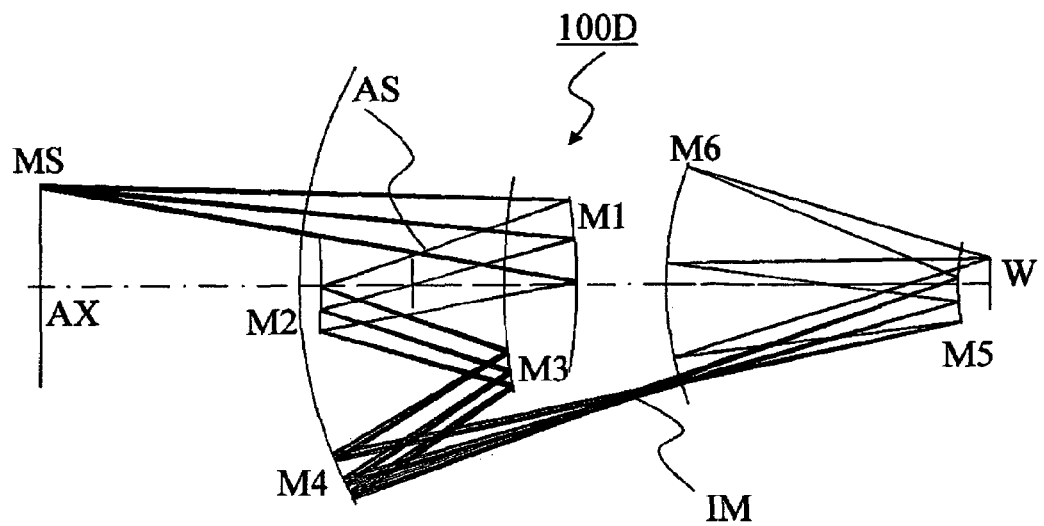
FIG. 5 is an optical path diagram showing a fifth embodiment of the present invention.

A description will be given of a projection optical system 100D according to a fifth embodiment of the present invention with reference to FIG. 5 and Table 5. Unless otherwise specified, this embodiment is similar to the first to fourth embodiments. The overall length of the fifth embodiment is about 1217.03 mm. An image-side numerical aperture NA is 0.3, a magnification is ¼, and an object point is 126.8 to 132.8 mm (while the image side has an arc field with a width A distance is 333.3 mm between the object plane and the plane apex of the fourth reflective surface as a reflective surface closest to the object plane, providing a sufficient front focus. An interval is 27.4 mm between the plane apex of the second reflective surface and the plane apex of the fourth reflective surface, and an interval is 117 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.941, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 23° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: θ11=10.8°. θ21=17.1°. θ31=26.4°. θ41=8.8°. θ51=12.1°. θ61=4.2°. Each incident angle upon the optical axis on each surface is as follows: θ12=5.9°. θ22=15.7°. θ32=18.6°. θ42=34.2°. θ52=16.6°. θ62=7.7°.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.268. Le2/TT=0.192. Le3/TT=0.215. Le0/TT=0.565. Le4/TT=0.694. Le5/TT=0.307. Le6/TT=0.339.

TABLE 5

| MIRROR NUMBER | RADIUS OF CURVATURE | PLANE APEX |
|---|---|---|
| M(MASK) | 0 | 687.366 |
| M1 | −681.249 | −213.179 |
| APERTURE | 0 | −113.491 |
| M2 | −1288.27 | 234.023 |
| M3 | 779.994 | −261.46 |
| M4 | 597.538 | 844.271 |
| M5 | 301.975 | −373.163 |
| M6 | 447.301 | 412.663 |
| W(WEFAR) | 0 | 0 |

ASPHERIC COEFFICIENT

| | K | A | B | C | D | E | F | G |
|---|---|---|---|---|---|---|---|---|
| M1 | −2.02386 | 1.00748E−09 | −2.82721E−14 | 6.72320E−19 | −1.62257E−23 | 2.52910E−28 | 2.36658E−33 | −1.05321E−37 |
| M2 | −102.576 | −7.93468E−09 | 2.57476E−13 | −1.76631E−17 | 5.16720E−21 | −1.17785E−24 | 1.45201E−28 | −7.14830E−33 |
| M3 | 2.029 | −1.75137E−09 | −1.19223E−13 | 1.39221E−17 | −9.58400E−22 | 3.99638E−26 | −9.26698E−31 | 9.18349E−36 |
| M4 | −0.019234 | 4.64214E−11 | −1.93545E−15 | 2.30505E−20 | −2.49297E−26 | −2.55693E−30 | 2.62026E−35 | −8.30837E−41 |
| M5 | 1.3655 | −7.42065E−09 | 1.53204E−12 | −7.41294E−17 | 3.69137E−21 | 2.39456E−24 | −8.42619E−28 | 8.92952E−32 |
| M6 | 0.0201243 | 5.37511E−11 | 3.39841E−16 | 1.95344E−21 | −1.45311E−26 | 1.79966E−30 | −5.51264E−35 | 6.61191E−40 |

Sixth Embodiment

Figure 6:
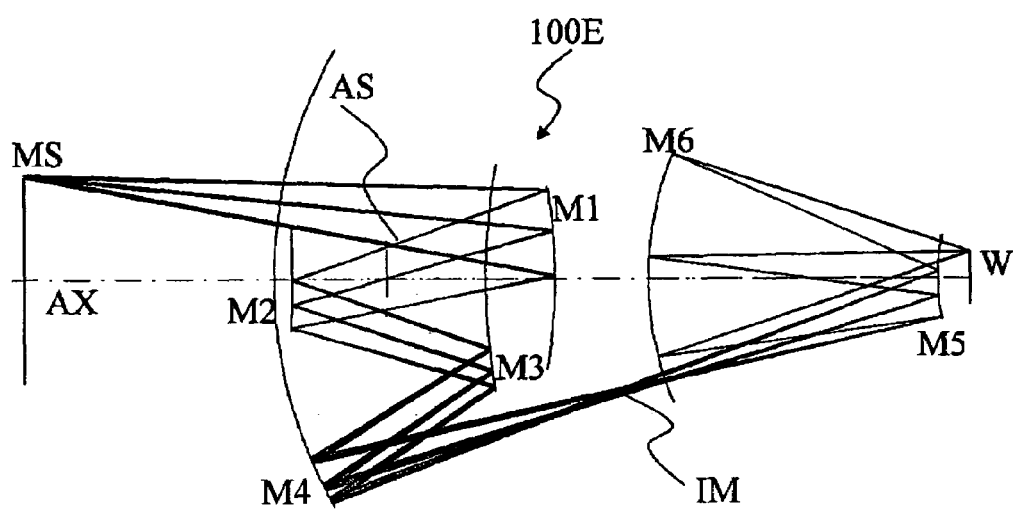
FIG. 6 is an optical path diagram showing a sixth embodiment of the present invention.

A description will be given of a projection optical system 100E according to a sixth embodiment of the present invention with reference to FIG. 6 and Table 6. Unless otherwise specified, this embodiment is similar to the first to fifth embodiments. The overall length of the sixth embodiment is about 1177.13 mm. An image-side numerical aperture NA is 0.32, a magnification is ¼, and an object point is 128.5 to 132.5 mm (while the image side has an arc field with a width of 1 mm). The wavefront aberration has a RMS of 14.2 mλ, and a static distortion range of 1.7 nm.

An arrangement of the aperture stop between M1 and M2 prevents shielding of the light from the object plane to M1, although the object-side telecentricity is as small as 107 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 130.5 mm is 50.2 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 568 mm.

Preferably, the aperture stop is distant from the first and second reflective surfaces M1 and M2 by a proper distance. In the instant embodiment, the aperture stop is distant from the first reflective surface M1 by 0.645 Lst, and from the second reflective surface M1 by 0.355 Lst, where Lst is an optical path length between the first and second reflective surfaces.

The third reflective surface is a surface that has the largest light incident angle among the six reflective surfaces, which is 27.1°. The incident angle distribution width is 1.80°. The small incident angle distribution prevents reductions of the reflectance due to the multilayer coating.

A distance is 311.2 mm between the object plane and the plane apex of the fourth reflective surface as a reflective surface closest to the object plane, providing a sufficient front focus. An interval is 22.8 mm between the plane apex of the second reflective surface and the plane apex of the fourth reflective surface, and an interval is 116 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.892, which is sufficient to provide a reduced incident angle, and a suffi-cient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 26.7° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: $\theta 11$=11.1°. $\theta 21$=17.4°. $\theta 31$=26.7°. $\theta 41$=8.6°. $\theta 51$=12.7°. $\theta 61$=4.4°. Each incident angle upon the optical axis on each surface is as follows: $\theta 12$=6.1°. $\theta 22$=16.1°. $\theta 32$=18.7°. $\theta 42$=34.7°. $\theta 52$=17.4°. $\theta 62$=7.9°.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.278. Le2/TT=0.204. Le3/TT=0.224. Le0/TT=0.562. Le4/TT=0.702. Le5/TT=0.306. Le6/TT=0.339.

TABLE 6

| MIRROR NUMBER | RADIUS OF CURVATURE | PLANE APEX |
|---|---|---|
| M(MASK) | 0 | 661.818 |
| M1 | −679.127 | −211.073 |
| APERTURE STOP | 0 | −116.028 |
| M2 | −1462.34 | 240.694 |
| M3 | 802.546 | −263.48 |
| M4 | 600.293 | 826.391 |
| M5 | 285.822 | −360.504 |
| M6 | 431.98 | 399.309 |
| W(WEFAR) | 0 | 0 |

ASPHERIC COEFFICIENT

| | K | A | B | C | D | E | F | G |
|---|---|---|---|---|---|---|---|---|
| M1 | −2.09435 | 1.13471E−09 | −3.50912E−14 | 9.98832E−19 | −3.73070E−23 | 1.59418E−27 | −5.20263E−32 | 8.46553E−37 |
| M2 | −90.7449 | −4.76165E−09 | 1.44614E−13 | −1.24484E−17 | 5.27782E−21 | −1.33171E−24 | 1.78795E−28 | −9.93666E−33 |
| M3 | 2.81481 | −1.35562E−09 | −1.39699E−13 | 1.45038E−17 | −9.13239E−22 | 3.49577E−26 | −7.45019E−31 | 6.79270E−36 |
| M4 | 0.0074938 | 6.81806E−11 | −2.19603E−15 | 2.21401E−20 | −1.05492E−27 | −2.24637E−30 | 1.96167E−35 | −5.36173E−41 |
| M5 | 1.34634 | −8.23739E−09 | 1.91735E−12 | −1.17376E−16 | 2.13264E−20 | −4.69506E−24 | 8.47933E−28 | −7.51998E−32 |
| M6 | 0.014386 | 6.58163E−11 | 4.41337E−16 | 2.44618E−21 | 2.21444E−26 | −3.62807E−31 | 1.31309E−35 | −1.41058E−40 |

Seventh Embodiment

Figure 7:
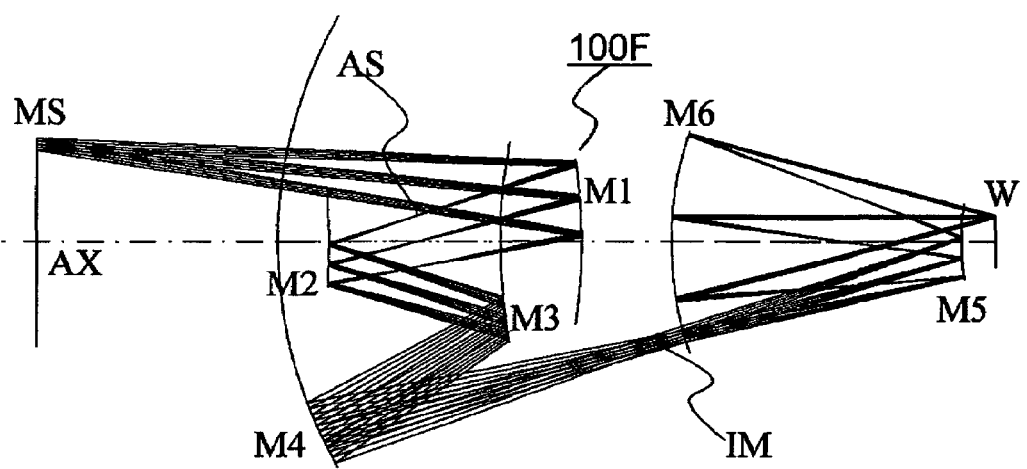
FIG. 7 is an optical path diagram showing a seventh embodiment of the present invention.

A description will be given of a projection optical system 100F according to a seventh embodiment of the present invention with reference to FIG. 7 and Table 7. Unless otherwise specified, this embodiment is similar to the first to sixth embodiments. The overall length of the seventh embodiment is about 1231.8 mm. An image-side numerical aperture NA is 0.26, a magnification is ¼, and an object point is 121 to 137 mm (while the image side has an arc field with a width of 4 mm). The wavefront aberration has a RMS of 15.6 mλ, and a static distortion range of 4.0 nm.

An arrangement of the aperture stop between M1 and M2 prevents shielding of the light from the object plane to M1, although the object-side telecentricity is as small as 103 mrad. Since M2 and M3 gradually introduce the light from the aperture stop to M4 apart from the optical axis, a distance between M3 and M4 can be relatively short although the maximum incident angle is maintained to be 27°. This distance and second reflective surface having a convex shape provide an appropriate divergence of the light on the fourth reflective surface M4.

More specifically, the divergence of the light on the fourth surface introduced from the object point of 129 mm is 49.7 mm. This configuration is less affected by the mirror surface's ripples, air bubbles in the mirror material, mirror's deformations, dust transfers, etc. due to the energy concentration, and is less likely to deteriorate the imaging performance, while maintaining the maximum effective diameter to be 582 mm.

Preferably, the aperture stop is distant from the first and second reflective surfaces M1 and M2 by a proper distance. In the instant embodiment, the aperture stop is distant from the first reflective surface M1 by 0.657 Lst, and from the second reflective surface M1 by 0.343 Lst, where Lst is an optical path length between the first and second reflective surfaces.

The third reflective surface is a surface that has the largest light incident angle among the six reflective surfaces, which is 27°. The incident angle distribution width is 3.50°. The small incident angle distribution prevents reductions of the reflectance due to the multilayer coating.

A distance is 309.8 mm between the object plane and the plane apex of the fourth reflective surface as a reflective surface closest to the object plane, providing a sufficient front focus. An interval is 64.0 mm between the plane apex of the second reflective surface and the plane apex of the fourth reflective surface, and an interval is 116 mm between the plane apex of the sixth reflective surface and the plane apex of the first reflective surface as a reflective surface that is closest to the sixth reflective surface. This configuration maintains a thickness of each mirror, and the space for arranging various mechanisms, such as an adjusting mechanism and a cooling mechanism. L1/L2 is 0.794, which is sufficient to provide a reduced incident angle, and a sufficient front focus, where L1 is an interval between the object plane and the plane apex of M4 that is the reflective surface closest to the object plane, and L2 is an interval between the plane apex of M4 that is the reflective surface closest to the object plane and the plane apex of the first reflective surface.

The convex surfaces of M2 and M3 enable the intermediate image to be formed at a position apart from the mirrors, and provide an appropriate divergence of the light on the mirror surface. Thereby, this configuration is less affected by the mirror surface's ripples, air bubbles in the mirror material, mirror's deformations, dust transfers, etc. due to the energy concentration, and is less likely to deteriorate the imaging performance. This intermediate image is formed between 0.4×Lim and 0.6×Lim where Lim is an optical path length between the fourth and fifth reflective surfaces.

The principal ray from the object point at the center of the arc-shaped illuminated area on the object plane has the following incident angles upon each surface: M3 has the maximum incident angle upon the plane normal, but its value is as small as 25.4° and less likely to cause an increase of an aberration and a decrease of the reflectance on the multilayer coating. In addition, since the incident angle gradually increases in order of M1, M2 and M3, the light from the object plane can be introduced to M4 without shielding. Each incident angle upon a plane normal on each surface is as follows: $\theta 11=10.5°$. $\theta 21=16.3°$. $\theta 31=25.4°$. $\theta 41=8.7°$. $\theta 51=12.0°$. $\theta 61=4.1°$. Each incident angle upon the optical axis on each surface is as follows: $\theta 12=5.9°$. $\theta 22=15.1°$. $\theta 32=17.5°$. $\theta 42=33.3°$. $\theta 52=15.9°$. $\theta 62=8.1°$.

Ratios will be discussed between the absolute values Le1 to Le6 of the respective plane apex intervals and the overall length TT: The absolute value Le1 of the plane apex interval between M1 and M2 is the largest. The absolute value Le2 of the plane apex interval between M2 and M3 is similar to the absolute value Le3 of the plane apex interval between M3 and M4. These ratios maintain the space to arrange each component, and facilitate the reflections of the light without shielding. Therefore, they are advantageous in the aberration and the characteristics of the multilayer coating. These ratios are as follows: Le1/TT=0.265. Le2/TT=0.179. Le3/TT=0.230. Le0/TT=0.568. Le4/TT=0.713. Le5/TT=0.302. Le6/TT=0.338.

TABLE 7

| MIRROR NUMBER | RADIUS OF CURVATURE | PLANE APEX |
|---|---|---|
| M(MASK) | 0 | 699.837 |
| M1 | −702.313 | −214.261 |
| APERTURE | 0 | −111.81 |
| M2 | −1439.7 | 220.059 |
| M3 | 697.033 | −284.029 |
| M4 | 614.085 | 878.59 |
| M5 | 317.899 | −372.549 |
| M6 | 450.292 | 415.949 |
| W(WEFAR) | 0 | 0 |

ASPHERIC COEFFICIENT

| | K | A | B | C | D | E | F | G |
|---|---|---|---|---|---|---|---|---|
| M1 | −1.68182 | 9.55118E−10 | −2.11336E−14 | 5.23131E−19 | −2.80887E−23 | 2.18057E−27 | −1.10436E−31 | 2.38501E−36 |
| M2 | 10.2595 | −2.23025E−09 | 7.71679E−14 | −9.73737E−18 | 2.12343E−21 | 1.07361E−25 | −1.30184E−28 | 1.62064E−32 |
| M3 | 0.945906 | −2.28616E−09 | −8.97921E−14 | 1.22418E−17 | −9.43003E−22 | 4.40866E−26 | −1.15116E−30 | 1.28818E−35 |
| M4 | −0.01009 | 7.43259E−11 | −2.23280E−15 | 2.05738E−20 | 2.01255E−26 | −2.37660E−30 | 2.03987E−35 | −5.83160E−41 |
| M5 | 0.248075 | −4.75145E−10 | 1.23412E−12 | −5.43969E−17 | 1.55145E−20 | −6.34084E−24 | 1.52607E−27 | −1.37322E−31 |
| M6 | 0.036824 | 3.42326E−11 | 2.29726E−16 | 2.03349E−21 | −7.23005E−26 | 5.58887E−30 | −1.95238E−34 | 2.71649E−39 |

Table 8 shows a relationship among θ11, θ21, θ31, θ12, θ22, and θ32 for each embodiment. Table 8 also shows A1, B1, A2 and B2 of the first to seventh embodiments. It is understood from Table 8 that A1, B1, A2 and B2 satisfy the conditional equations.

optical system 230 to illuminate the mask 220, and includes an EUV light source 212 and an illumination optical system 214.

The EUV light source 212 uses, for example, a laser plasma light source. The laser plasma light source irradiates

TABLE 8

| | FIRST EMBODIMENT | SECOND EMBODIMENT | THIRD EMBODIMENT | FOURTH EMBODIMENT | FIFTH EMBODIMENT | SIXTH EMBODIMENT | SEVENTH EMBODIMENT |
|---|---|---|---|---|---|---|---|
| θ11 | 10.4 | 10.3 | 10.3 | 10.8 | 10.8 | 11.1 | 10.5 |
| θ21 | 16 | 15.8 | 15.8 | 17 | 17.1 | 17.4 | 16.3 |
| θ31 | 25.1 | 24.8 | 24.7 | 26.1 | 26.4 | 26.7 | 25.4 |
| θ12 | 5.9 | 5.9 | 5.9 | 5.9 | 5.9 | 6.1 | 5.9 |
| θ22 | 14.9 | 14.7 | 14.6 | 15.7 | 15.7 | 16.1 | 15.1 |
| θ32 | 17.2 | 16.9 | 16.9 | 18.3 | 18.6 | 18.7 | 17.5 |
| A1 = θ21/θ11 | 1.5385 | 1.5340 | 1.5340 | 1.5741 | 1.5833 | 1.5676 | 1.5524 |
| B1 = θ31/θ11 | 2.4135 | 2.4078 | 2.3981 | 2.4167 | 2.4444 | 2.4054 | 2.4190 |
| A2 = θ22/θ12 | 2.5254 | 2.4915 | 2.4746 | 2.6610 | 2.6610 | 2.6393 | 2.5593 |
| B2 = θ32/θ12 | 2.9153 | 2.8644 | 2.8644 | 3.1017 | 3.1525 | 3.0656 | 2.9661 |

Eighth Embodiment

A description will now be given of an exposure apparatus 200 that includes the projection optical system 100 to 100F according to the first to seventh embodiments, with reference to FIG. 8. Here, FIG. 8 is a schematic block diagram of the exposure apparatus 200.

The exposure apparatus 200 uses the EUV light (with a wavelength, for example, of 13.5 nm) as illumination light for exposure, and exposes onto the plate 240 a circuit pattern of a mask 220, for example, in a step-and-scan manner. However, the present invention is applicable of an exposure apparatus in a step-and-repeat or another manner. This exposure apparatus is suitable for a lithography process less than submicron or quarter micron, and the present embodiment uses the step-and-scan exposure apparatus (also referred to as a "scanner") as an example. The "step-and-scan manner," as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Figure 8:
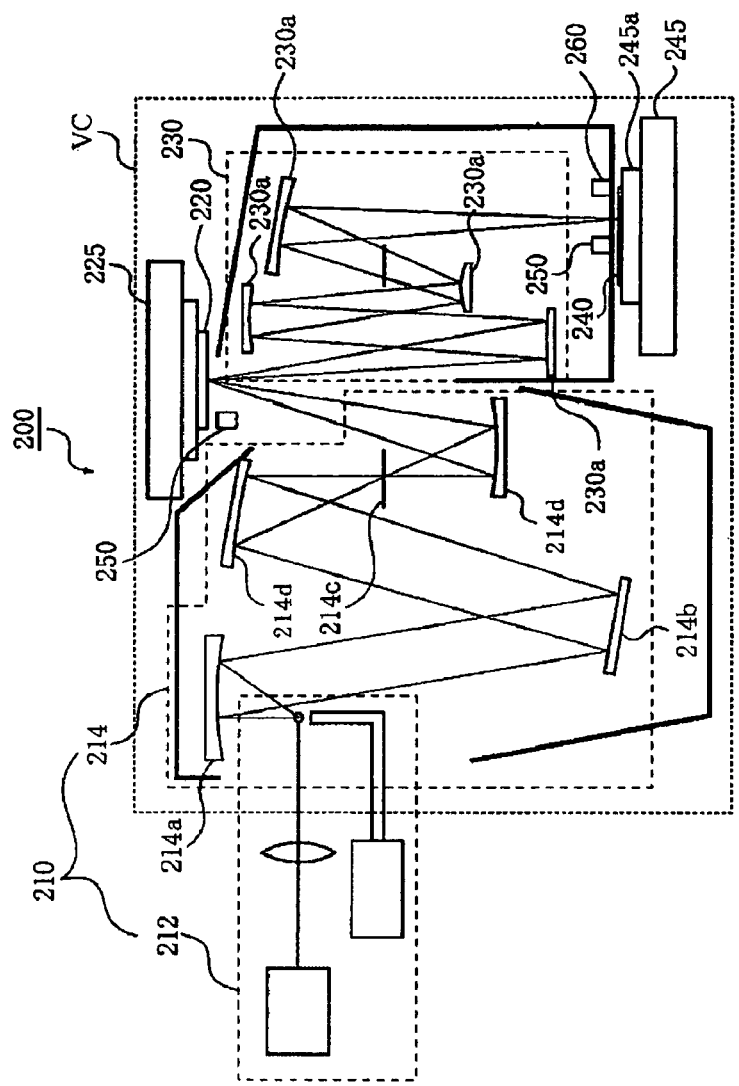
FIG. 8 is a schematic sectional view of a structure of an exposure apparatus according to one aspect of the present invention.

Referring to FIG. 8, the exposure apparatus 200 includes an illumination apparatus 210 for illuminating the mask 220 using the light from a light source, a mask stage 225 that supports the mask 220, a projection optical system 230 (100, or the like) for introducing the light from the mask 220 to the plate 240 to be exposed, a wafer stage 245 that supports the plate 240, an alignment detection mechanism 250, and a focus position detection mechanism 260. Although FIG. 8 schematically shows a four-mirror projection optical system 230, the number of reflective surfaces in the catoptric projection optical system is six as in the above first to seventh embodiments. Of course, the number of mirrors can be increased within a scope of the present invention.

At least the optical path through which the EUV light travels is preferably be maintained in a vacuum atmosphere VC, although shown in FIG. 8, since the EUV light has low transmittance for air and the residue gas (such as polymer organic gas) causes contaminations.

The illumination apparatus 210 uses the EUV light of an arc shape corresponding to an arc field of the projection a highly intensified pulse laser beam to a target material put in vacuum, thus generating high-temperature plasma for use as EUV light with a wavelength of about 13 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 214 includes a condenser mirror 214a, an optical integrator 214b, an aperture 214c, and a deflecting mirror 214d. The condenser mirror 214a serves to collect the EUV light that is isotropically irradiated from the laser plasma. The optical integrator 214b serves to uniformly illuminate the mask 220 with a predetermined NA. The illumination optical system 214 further includes an aperture 214c to limit an illumination area to an arc shape at a position conjugate with the mask 220. The illumination optical system 214 may further include a cooling apparatus for cooling the optical elements, such as the condenser mirror 214a and the optical integrator 214b. The cooling apparatus cools the condenser mirror 214a and optical integrator 214b, and prevents deformation due to the thermal expansion for excellent imaging performance.

The mask 220 is a reflection mask that has a circuit pattern or image to be transferred, and supported and driven by the mask stage 225. The diffracted light from the mask 220 is reflected by the projection optical system 230 (100 etc.) discussed in the first to seventh embodiments and projected onto the plate 240. The mask 220 and the plate 240 are arranged optically conjugate with each other. The exposure apparatus 200 is a step-and-scan exposure apparatus, and projects a reduced size of the pattern on the mask 220 on the plate 240 by scanning the mask 220 and the plate 240.

The mask stage 225 supports the mask 220 and is connected to a moving mechanism (not shown). The mask stage 225 may use any structure known in the art. A moving mechanism (not shown) may include a linear motor etc., and drives the mask stage 225 at least in an X direction and moves the mask 220. The exposure apparatus 200 synchronously scans the mask 220 or the plate 240.

The projection optical system 230 uses one of the above projection systems 100, 100A, etc. The projection optical system 230 uses plural multilayer mirrors 230a to project a reduced size of a pattern formed on the mask 220 onto the plate 240. In order to realize a wide exposure area with the small number of mirrors, the mask 220 and plate 240 are simultaneously scanned to transfer a wide area that is an arc-shaped area or ring field apart from the optical axis by a predetermined distance. The projection optical system 230 has a NA of about 0.2 to 0.3. A cooling apparatus can cool an optical element in the projection optical system 230 such as the mirror 230a. The cooling apparatus cools the mirror 230a, and prevents deformation due to the thermal expansion for excellent imaging performance.

The instant embodiment uses a wafer as the plate 240 to be exposed, but it may include a liquid crystal plate and a wide range of other plates to be exposed. A photoresist is applied onto the plate 240.

The wafer stage 245 holds the plate 240 by a wafer chuck 245a. The wafer stage 245 moves the plate 240, for example, using a linear stage in XYZ directions. The mask 220 and the plate 240 are synchronously scanned. The positions of the mask stage 225 and wafer stage 245 are monitored, for example, by a laser interferometer, and driven at a constant speed ratio.

The alignment detection mechanism 250 measures a positional relationship between the position of the mask 220 and the optical axis of the projection optical system 230, and a positional relationship between the position of the plate 240 and the optical axis of the projection optical system 230, and sets positions and angles of the mask stage 225 and the wafer stage 245 so that a projected image of the mask 220 may be positioned in place on the plate 240.

A focus position detection mechanism 260 measures a focus position on the plate 240 plane, and its control over positions and angles of the wafer stage 245 always maintain the plate 240 plane at an imaging position of the projection optical system 230 during exposure.

In exposure, the EUV light emitted from the illumination apparatus 210 illuminates the mask 220, and images a pattern of the mask 220 onto the plate 240 surface. This embodiment uses an arc or ring shaped image plane, scans the mask 220 and plate 240 at a speed ratio corresponding to a reduction ratio to expose the entire surface of the mask 220. The projection optical system 230 (100) can realize a high NA and a high throughput with a space-saving structure, and provide a desired resolution, such as 32 nm node.

Figure 9:
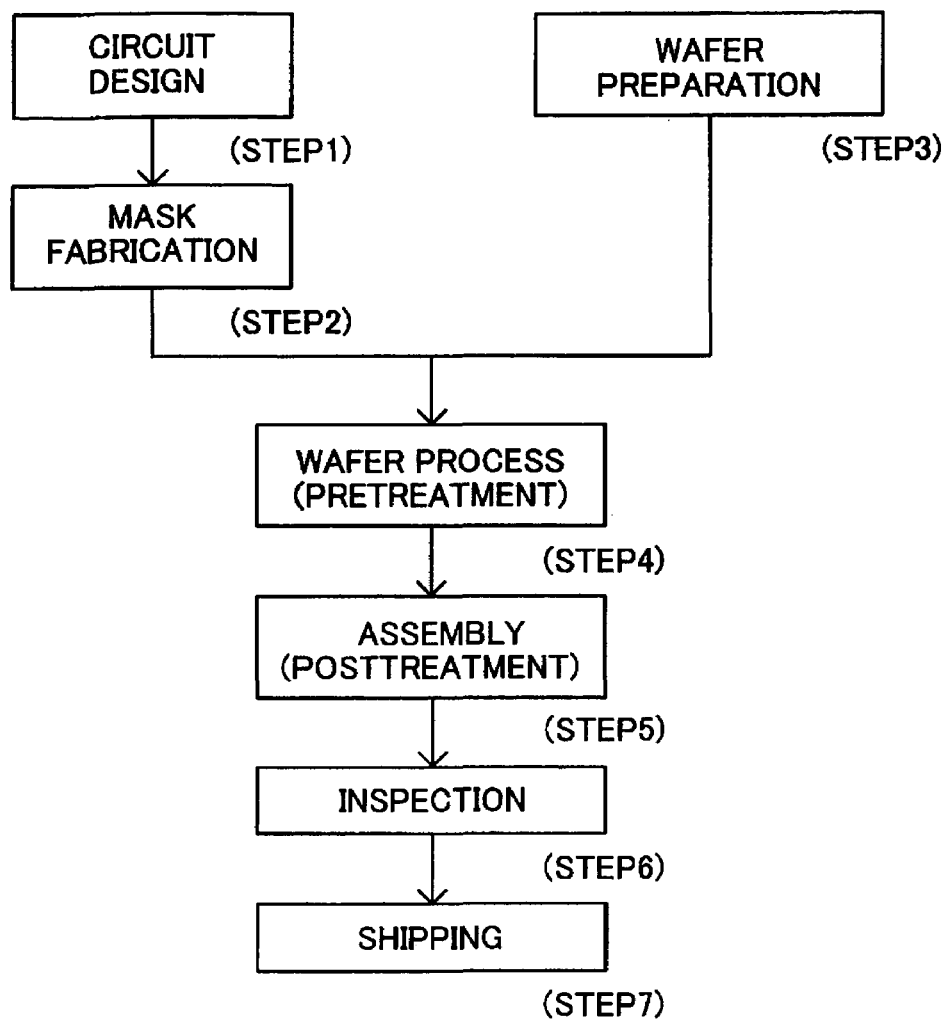
FIG. 9 is a flowchart for explaining manufacture of devices (such as semiconductor chips such as ICs and LCDs, CCDs, and the like).
Figure 10:
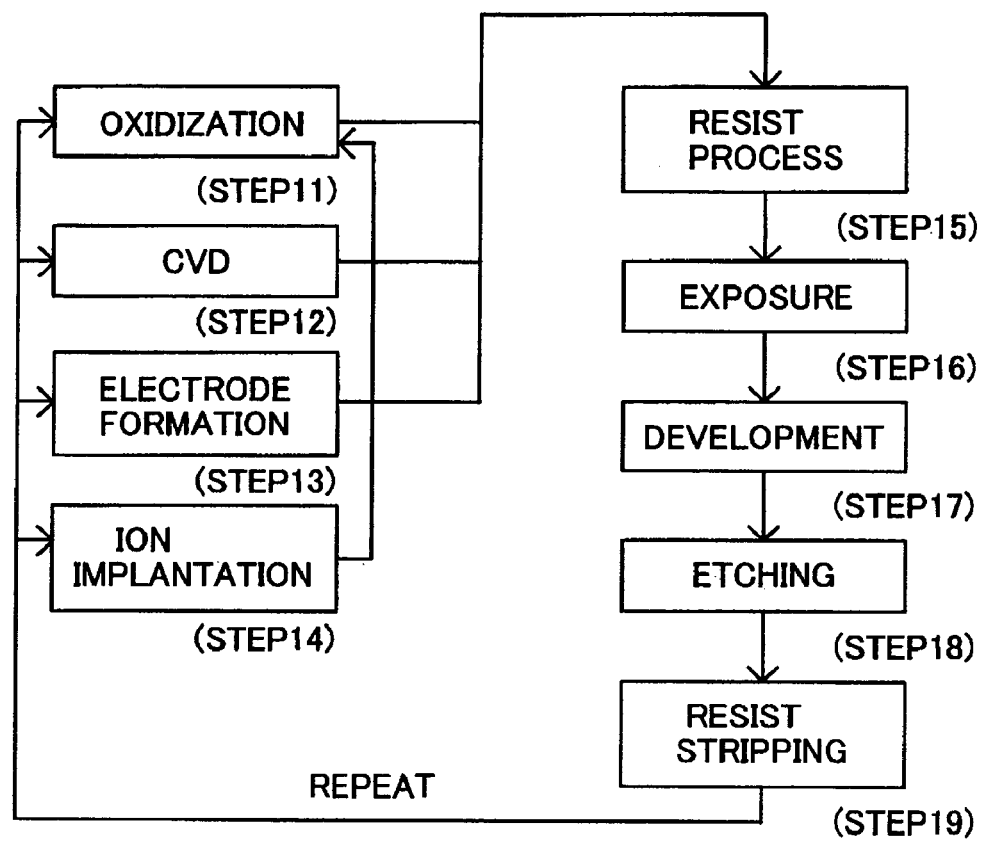
FIG. 10 is a detail flowchart of a wafer process as Step 4 shown in FIG. 9.

Referring to FIGS. 9 and 10, a description will now be given of an embodiment of a device manufacturing method using the above exposure apparatus 200. FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through the photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacturing method of this embodiment can manufacture higher quality devices than the conventional one. Thus, the device manufacturing method using the exposure apparatus 200, and the devices as finished goods also constitute one aspect of the present invention.

Further, the present invention is not limited to these preferred embodiments, and various variations and modifications may be made without departing from the scope of the present invention.

This application claims a foreign priority benefit based on Japanese Patent Application No. 2005-056701, filed on Mar. 1, 2005, which is hereby incorporated by reference herein in its entirety as if fully set forth herein.

What is claimed is:

1. A projection optical system for projecting a pattern on an object plane onto an image plane, said projection optical system comprising first to sixth reflective surfaces in order to reflect light from the object plane, the light from the object plane being reflected in order of the first reflective surface, the second reflective surface, third reflective surface, the fourth reflective surface, the fifth reflective surface, and the sixth reflective surface, wherein A1=θ21/θ11, B1=θ31/θ11, 1.5<A1<1.65, and 2.3<B1<2.5 are met, where θ11 is an angle on a predetermined plane between a first principal ray and a first plane normal, θ21 is an angle between a second principal ray and a second plane normal on the predetermined plane, and θ31 is an angle between a third principal ray and a third plane normal on the predetermined plane, wherein the first principal ray is a principal ray that is exited from a center of an arc-shaped illuminated area on the object plane and incident upon the first reflective surface, and the first plane normal is a plane normal to the first reflective surface at an incident position of the first principal ray that is exited from the center of the illumination area and incident upon the first reflective surface, wherein the second principal ray is a principal ray that is exited from the center of the illumination area, reflected on the first reflective surface, and incident upon the second reflective surface, and the second plane normal is a plane normal to the second reflective surface at an incident position of the second principal ray that is exited from the center of the illumination area, reflected on the first reflective surface, and incident upon the second reflective surface, and wherein the third principal ray is a principal ray that is exited from the center of the illumination area, reflected on the second reflective surface, and incident upon the third reflective surface, and the third plane normal is a plane normal to the third reflective surface at an incident position of the third principal ray that is exited from the center of the illumination area, reflected on the second reflective surface, and incident upon the third reflective surface.

2. A projection optical system according to claim 1, wherein the second reflective surface has a convex shape.

3. A projection optical system according to claim 1, wherein the third reflective surface has a convex shape.

4. A projection optical system according to claim 1, wherein the first reflective surface has a concave shape.

5. A projection optical system according to claim 1, wherein the fourth reflective surface has a concave shape.

6. A projection optical system according to claim 1, wherein an intermediate image is formed between the fourth reflective surface and the fifth reflective surface.

7. A projection optical system according to claim 1, further comprising an aperture stop between the first reflective surface and the second reflective surface on an optical path.

8. A projection optical system according to claim 1, wherein 0.75<L1/L2<1.25 is met, where L1 is an interval between the object plane and a plane apex closest to the object plane, and L2 is an interval between a plane apex closest to the object plane and a plane apex of the first reflective surface.

9. An exposure apparatus comprising:
   an illumination optical system for illuminating a pattern of an object plane using light from a light source; and
   a projection optical system according to claim 1 for projecting the pattern of the object plane onto an image plane.

10. A device manufacturing method comprising the steps of:
   exposing a plate using an exposure apparatus according to claim 9; and
   developing the plate that has been exposed.

* * * * *